(12) United States Patent
Yeom et al.

(10) Patent No.: US 12,725,762 B2
(45) Date of Patent: Sep. 1, 2026

(54) METHOD FOR ETCHING ATOMIC LAYER

(71) Applicants: RESEARCH & BUSINESS FOUNDATION SUNGKYUNKWAN UNIVERSITY, Gyeonggi-Do (KR); IUCF-HYU (Industry-University Cooperation Foundation Hanyang University), Seoul (KR)

(72) Inventors: Geun Young Yeom, Seoul (KR); Chin Wook Chung, Seoul (KR); Yun Jong Jang, Seoul (KR); Doo San Kim, Suwon-si (KR); Ye Eun Kim, Suwon-si (KR); Hong Seong Gil, Suwon-si (KR); Hae In Kwon, Suwon-si (KR); Jun Young Park, Goyang-si (KR); Ji Won Jung, Seoul (KR)

(73) Assignees: Research & Business Foundation Sungkyunkwan University, Gyeonggi-Do (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 328 days.

(21) Appl. No.: 18/499,543

(22) Filed: Nov. 1, 2023

(65) Prior Publication Data

US 2024/0177972 A1 May 30, 2024

(30) Foreign Application Priority Data

Nov. 28, 2022 (KR) ........................ 10-2022-0161244

(51) Int. Cl.
*H01J 37/32* (2006.01)
*H10P 50/24* (2026.01)

(52) U.S. Cl.
CPC .. *H01J 37/32422* (2013.01); *H01J 37/32449* (2013.01); *H10P 50/242* (2026.01); *H01J 2237/3341* (2013.01); *H01J 2237/338* (2013.01)

(58) Field of Classification Search
CPC ........... H01J 37/32422; H01J 37/32449; H01J 2237/3341; H01J 2237/338;
(Continued)

(56) References Cited

U.S. PATENT DOCUMENTS 10,475,626 B2 11/2019 Collins et al.
11,637,022 B2 4/2023 Berry et al.
(Continued)

FOREIGN PATENT DOCUMENTS

KR 10-2011-0092485 A 8/2011
KR 2017-0130467 A 11/2017
(Continued)

*Primary Examiner* — Anita K Alanko
(74) *Attorney, Agent, or Firm* — Harness, Dickey & Pierce, P.L.C.

(57) ABSTRACT

Provided is a method for etching an atomic layer. The method for etching the atomic layer includes providing a substrate to a process chamber, wherein the process chamber comprises a first chamber part and a second chamber part, and the substrate is provided in the second chamber part, generating adsorption gas plasma in the first chamber part, adsorbing radicals of the adsorption gas plasma to the substrate so as to form a treatment layer, generating etching gas plasma in the first chamber part, and allowing electrons and ions of the etching gas plasma to be alternately incident into the treatment layer so as to perform desorption of the treatment layer.

16 Claims, 23 Drawing Sheets

(58) Field of Classification Search
CPC ........... H01J 37/32899; H01J 2237/334; H01J 37/32146; H01L 21/3065; H01L 21/67069; H10P 50/242
See application file for complete search history.

(56) References Cited

U.S. PATENT DOCUMENTS

| | | | | |
|---|---|---|---|---|
| 12,148,626 | B2 * | 11/2024 | Yeom | H01L 21/31116 |
| 2004/0163763 | A1 | 8/2004 | Martin et al. | |
| 2011/0192820 | A1 | 8/2011 | Yeom et al. | |
| 2019/0108982 | A1 * | 4/2019 | Yang | H01J 37/32449 |
| 2019/0221437 | A1 | 7/2019 | Yang et al. | |
| 2021/0280433 | A1 * | 9/2021 | Berry, III | H01L 21/31122 |
| 2022/0165546 | A1 * | 5/2022 | Lill | H01L 21/31116 |
| 2022/0199457 | A1 | 6/2022 | Yang et al. | |
| 2022/0375761 | A1 * | 11/2022 | Yeom | H01L 21/32136 |

FOREIGN PATENT DOCUMENTS

| | | | |
|---|---|---|---|
| KR | 10-2018-0131370 | A | 12/2018 |
| KR | 2021-0019121 | A | 2/2021 |

* cited by examiner

| $V_{sub}$ | 0 | 20 | 30 | 40 | 50 | 60 | 70 | 80 | 90 |
| --- | --- | --- | --- | --- | --- | --- | --- | --- | --- |
| $V_p$ | 6 | 36 | 30 | 40 | 49.5 | 60.4 | 70.8 | 80.3 | 89.6 |

| $V_{sub}$ | 0 | 20 | 30 | 40 | 50 | 60 | 70 | 80 | 90 |
|---|---|---|---|---|---|---|---|---|---|
| $V_p$ | 1.2 | 39 | 40.8 | 40.8 | 52.9 | 62.5 | 72.6 | 82.1 | 89.9 |

METHOD FOR ETCHING ATOMIC LAYER

CROSS-REFERENCE TO RELATED APPLICATIONS

This U.S. non-provisional patent application claims priority under 35 U.S.C. § 119 of Korean Patent Application No. 10-2022-0161244, filed on Nov. 28, 2022, the entire contents of which are hereby incorporated by reference.

BACKGROUND

The present disclosure herein relates to a method for etching an atomic layer, and more particularly, to a method for etching an atomic layer using electrons.

Semiconductor devices may be manufactured through various processes. For example, semiconductor devices may be manufactured by performing a photo process, an etching process, a deposition process, and the like on a wafer such as silicon.

The etching of the atomic layer may be applied in various manners to the processes of manufacturing the semiconductor device. The etching of the atomic layer may be carried out by chemical, thermal, or physical methods, and may be attracting attention as a next-generation etching technology as a technology of etching materials one by one in atomic units. To implement precise etching of the atomic layer, it is necessary to etch an object to be etched while maintaining structural integrity of the object.

SUMMARY

The present disclosure provides a method for etching an atomic layer, which is capable of minimizing structural deformation.

The present disclosure also provides a method for more accurately etching an atomic layer by adjusting a voltage of a grid and a substrate.

The object of the present invention is not limited to the aforesaid, but other objects not described herein will be clearly understood by those skilled in the art from descriptions below.

An embodiment of the inventive concept provides a method for etching an atomic layer, the method including: providing a substrate to a process chamber, wherein the process chamber includes a first chamber part and a second chamber part, and the substrate is provided in the second chamber part; generating adsorption gas plasma in the first chamber part; adsorbing radicals of the adsorption gas plasma to the substrate so as to form a treatment layer; generating etching gas plasma in the first chamber part; and allowing electrons and ions of the etching gas plasma to be alternately incident into the treatment layer so as to perform desorption of the treatment layer, wherein the adsorbing of the radicals of the adsorption gas plasma to the substrate includes allowing the radicals of the adsorption gas plasma to pass from the first chamber part to the second chamber part, and the allowing of the electrons and ions of the etching gas plasma to be alternately incident into the treatment layer includes adjusting a voltage applied to a plurality of grids between the first chamber part and the second chamber part or the substrate to allow the electrons and ions of the etching gas plasma to be incident into the treatment layer.

In an embodiment of the inventive concept, a method for etching an atomic layer includes: providing a substrate to a process chamber, wherein the process chamber includes a first chamber part and a second chamber part, and the substrate is provided in the second chamber part; generating adsorption gas plasma in the first chamber part; adsorbing radicals of the adsorption gas plasma to the substrate so as to form a treatment layer; generating etching gas plasma in the first chamber part; and allowing electrons and ions of the etching gas plasma to be alternately incident into the treatment layer so as to perform desorption of the treatment layer, wherein a plurality of grids are provided between the first chamber part and the second chamber part, and the performing the desorption of the treatment layer includes adjusting a density of the etching gas plasma of the chamber or a voltage applied to the plurality of grids to adjust isotropic or anisotropic desorption of the treatment layer.

In an embodiment of the inventive concept, a method for etching an atomic layer includes: providing a substrate to a process chamber, wherein the process chamber includes a first chamber part and a second chamber part, and the substrate is provided in the second chamber part; generating adsorption gas plasma in the first chamber part; adsorbing radicals of the adsorption gas plasma to the substrate so as to form a treatment layer; generating etching gas plasma in the first chamber part; allowing electrons of the etching gas plasma to be incident into the treatment layer so as to remove a portion of the treatment layer; and allowing ions of the etching gas plasma to being incident into the treatment layer, into which the elections are incident, to charge-neutralize the treatment layer, wherein the radicals of the adsorption gas plasma pass from the first chamber part to the second chamber part, the removing of the portion of the treatment layer and the charge-neutralizing of the treatment layer are repeatedly performed until the treatment layer is completely detached, a voltage applied to a plurality of grids between the first chamber part and the second chamber part or the substrate is adjusted so that the electrons or the ions of the etching gas plasma are incident into the treatment layer, and a density of the etching gas plasma of the first chamber part or the voltage of the grids is adjusted to adjust isotropic desorption or anisotropic desorption of the treatment layer.

Particularities of other embodiments are included in the detailed description and drawings.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Hereinafter, embodiments of the inventive concept will be described in detail with reference to the accompanying drawings.

A method and apparatus for etching a semiconductor substrate and layers formed on the semiconductor substrate during manufacture of semiconductor elements are proposed in embodiments of the inventive concept.

For example, in atomic layer etching (ALE), a surface of a material of an object to be etched may react to form a treatment layer, and then, a process of removing (desorption process) only the treatment layer may be repeatedly performed to etch the treatment layer one by one in atomic units.

In the atomic layer etching, ion bombardment may be used to apply a physical impact when removing a treatment layer. In the atomic layer etching using ions, since an ion energy distribution follows Maxwell-Boltzmann distribution, it is difficult to precisely adjust ion energy because the ion energy is not specified to one energy point.

Hereinafter, in the embodiments of the inventive concept, in the case of the desorption of the treatment layer, since the electrons, not the ions are used, the structural deformation of the material of the object to be etched may be minimized, and changes in electrical characteristic may be minimized.

Figure 1:
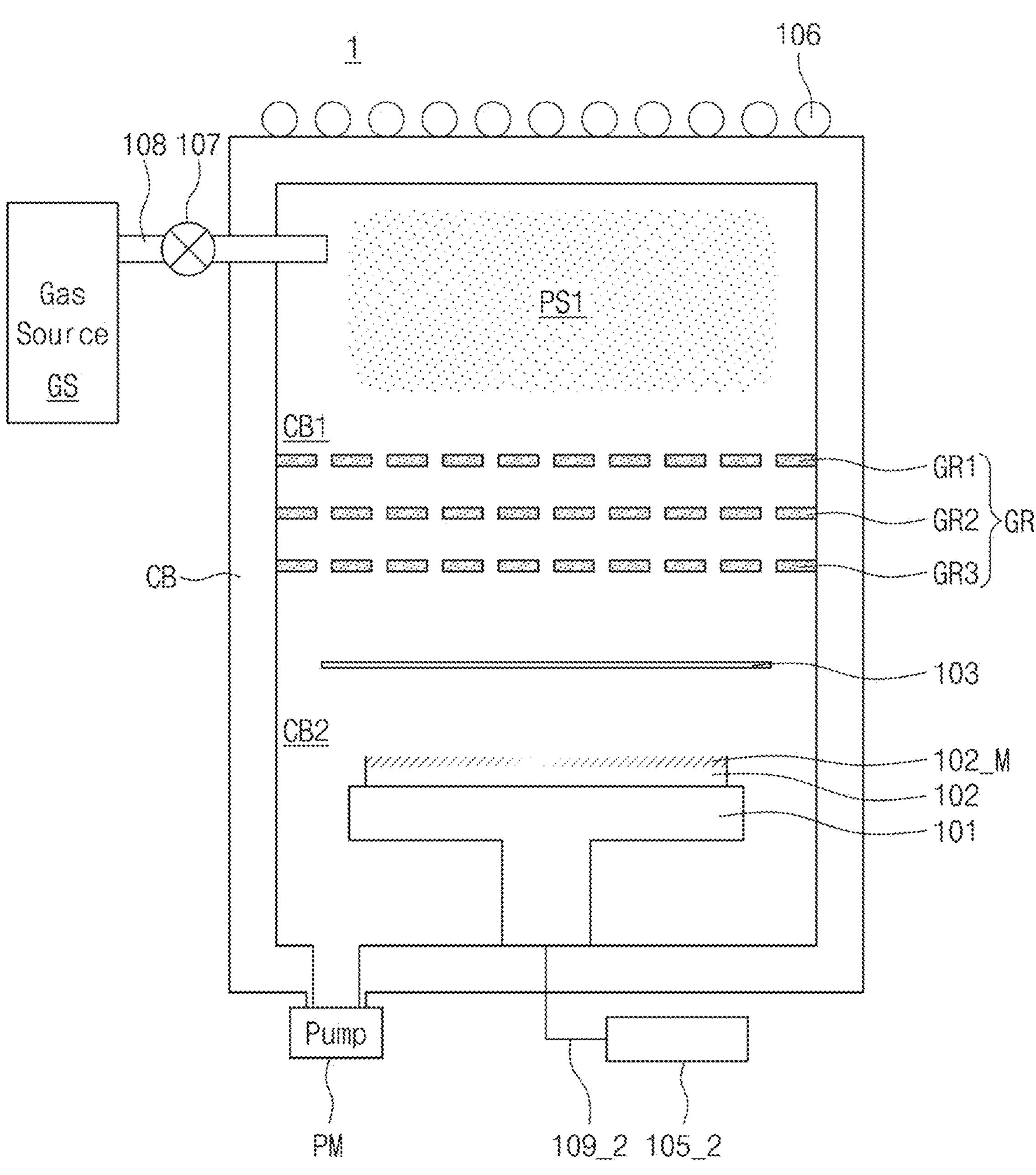
FIG. 1 is a cross-sectional view illustrating an apparatus for etching an atomic layer according to some embodiments.

FIG. 1 is a cross-sectional view illustrating an apparatus 1 for etching an atomic layer (hereinafter, referred to as an atomic layer etching apparatus 1) according to some embodiments.

Referring to FIG. 1, an atomic layer etching apparatus 1 is provided. The atomic layer etching apparatus 1 may etch various objects. For example, the atomic layer etching apparatus 1 may etch a substrate or a mask. That is, the atomic layer etching apparatus 1 may be apparatus for etching one surface of the substrate or mask to form a pattern thereon.

Referring to FIG. 1, the atomic layer etching apparatus 1 is provided. In the atomic layer etching apparatus 1, an adsorption process and a desorption process for the atomic layer etching may be performed. The atomic layer etching apparatus 1 may include a process chamber CB, a gas source GS, a gas inlet 108, a valve 107, a coil part 106, a power supply part 105_2, a voltage feeding part 109_2, a grid GR, a shutter 103, a support 101, and a pump PM.

The process chamber CB may include a first chamber part CB1 and a second chamber part CB2. The first chamber part CB1 may be disposed on the second chamber part CB2. The grid GR may be disposed between the first chamber part CB1 and the second chamber part CB2.

The gas inlet 108 may be connected to the first chamber part CB1 and the gas source GS. The gas inlet 108 may supply gases of the gas source GS into the first chamber part CB1 through the valve 107. In an embodiment, the gases of the gas source GS may be provided into the first chamber part CB1. A flow rate, a density, etc., of each of the gases of the gas source GS may be adjusted to be supplied into the first chamber part CB1.

The gases of the gas source GS may include an adsorption gas or an etching gas.

The coil part 106 may be disposed on one sidewall of the first chamber part CB1. In an embodiment, the coil part 106 may be a metal. The coil part 106 may be a plasma source. The first chamber part CB1 of the process chamber CB may be discharged through the coil part 106.

A voltage may be applied through the coil part 106 to form gas plasma PS1 in the first chamber part CB1 of the process chamber CB. The gas plasma PS1 may include radicals, electrons, and ions of the gas. The gas plasma PS1 may include adsorption gas plasma and etching gas plasma.

The first chamber part CB1 and the second chamber part CB2 may be defined based on the grid GR. The grid GR may include a plurality of grids GR. The grid GR may include a first grid GR1, a second grid GR2, and a third grid GR3. The first grid GR1 may be a grid adjacent to a first chamber part CB1. The third grid GR3 may be a grid adjacent to a second chamber part CB2. The second grid GR2 may be disposed between the first grid GR1 and the third grid GR3. In an embodiment, the grid GR may include a metal. The grid GR may include, for example, graphite or molybdenum. In the adsorption process, a voltage may be applied or may not be applied to the grid GR.

The shutter 103 may be disposed in the second chamber part CB2. The radicals of the gas plasma PS1 in the first chamber part CB1 of the process chamber CB may pass from the first chamber part CB1 to the second chamber part CB2 through the shutter 103. In an embodiment, the shutter 103 may include a metal. The shutter 103 may include, for example, stainless steel or the like.

The support 101 may be disposed in the second chamber part CB2. The support 101 may support the substrate 102. The support 101 may include a metal. Any voltage may be applied to the support 101. In the adsorption process, a voltage may be applied or may not be applied to the support 101.

The substrate 102 may be disposed on the support 101. The substrate 102 may include a metal or a metal compound. The substrate 102 may include at least one of copper (Cu), chromium (Cr), nickel (Ni), aluminum (Al), other metals, or alloys thereof. In an embodiment, the substrate 102 may include silicon (Si). For example, the substrate 102 may include a silicon wafer.

The power supply part 105_2 may apply a voltage to the support 101. In an embodiment, the power of the power supply part 105_2 may be applied to the support 101 through the voltage feeding part 109_2. The power of the power supply part 105_2 may be applied to the substrate 102 through the voltage feeding part 109_2 and the support 101.

Since the voltage applied to the substrate 102*a* is adjusted, only the electrons or only the ions of the gas plasma PS1 may be incident into the treatment layer 102_M of the substrate 102*a*.

When the gas plasma PS1 is the etching gas plasma, if the electrons of the etching gas plasma PS1 are incident into the treatment layer 102_M, the treatment layer 102_M may be removed. When the ions of the etching gas plasma PS1 are incident into the treatment layer 102_M, the substrate 102*a* may be charge-neutralized. The removal of the treatment layer 102_M may be performed by allowing the electrons to be incident into the treatment layer 102_M. When the ions are incident into the treatment layer 102_M, the treatment layer 102_M may not be removed because energy of the ions is very low.

The pump PM may be connected to the process chamber CB to enable a vacuum control during the etching process and remove gaseous byproducts from the process chamber CB. In an embodiment, in a purge process, gaseous byproducts of the process chamber CB may be discharged through the pump.

The shutter 103 of the atomic layer etching apparatus 1 may be opened to perform the desorption process. As the shutter 103 is opened in the desorption process, the electrons or ions passing through the grid GR may not be restricted by the shutter 103.

The grid GR may be disposed between the first chamber part CB1 and the second chamber part CB2. The grid GRa may include a plurality of grids GRa. The grid GRa may include a first grid GR1*a*, a second grid GR2*a*, and a third grid GR3*a*. In the desorption process, a voltage may or may not be applied to the grids GRa. Since The voltage applied to the grid GRa is adjusted, only the electrons or only the ions of the gas plasma PS1 may pass through the plurality of grids GRa.

As the adsorption process precedes, the substrate 102*a* on the support 101 may include the treatment layer 102_M modified in the adsorption process and the substrate 102 that is not modified. In an embodiment, the radicals of the adsorption gas plasma PS1 may be incident into and react with the substrate 102 to form the modified treatment layer 102_M. Bonding energy between the atoms of the modified treatment layer 102_M may be weaker than bonding energy between the atoms of the unmodified substrate 102.

In an embodiment, during the adsorption process, an adsorption gas may be provided into the first chamber part CB1 from the gas source GS through the gas inlet 108 and the valve 107. Thereafter, the adsorption gas plasma PS1 may be generated in the first chamber part CB1 of the process chamber CB by the voltage applied to the coil part 106. The radicals of the adsorption gas plasma PS1 may pass through the shutter 103 and be incident into the substrate 102. The radicals may be incident into the substrate 102 to form the treatment layer 102_M to be described later in FIG. 2. After the adsorption process is performed until the treatment layer 102_M having a desired thickness is formed on the entire surface of the substrate 102, the residual gas may be discharged through the pump in the purge process.

In an embodiment, during the desorption process, the etching gas may be supplied from the gas source GS into the first chamber part CB1 through the gas inlet 108 and the valve 107. Thereafter, the voltage may be applied by the coil part 106 to form the etching gas plasma PS1 in the first chamber part CB1 of the process chamber CB. The electrons or ions of the etching gas plasma PS1 may pass through the grids GR and the opened shutter 103 and then be incident into the treatment layer 102_M. The electrons may be incident into the treatment layer 102_M to remove the treatment layer 102_M. The ions may be incident into the treatment layer 102_M to charge-neutralize the treatment layer 102_M. The removal of the treatment layer 102_M and the charge neutralization may be repeated until the entire treatment layer 102_M is detached. A residual gas after the desorption process may be discharged through the pump PM in the purge process.

Figure 2:
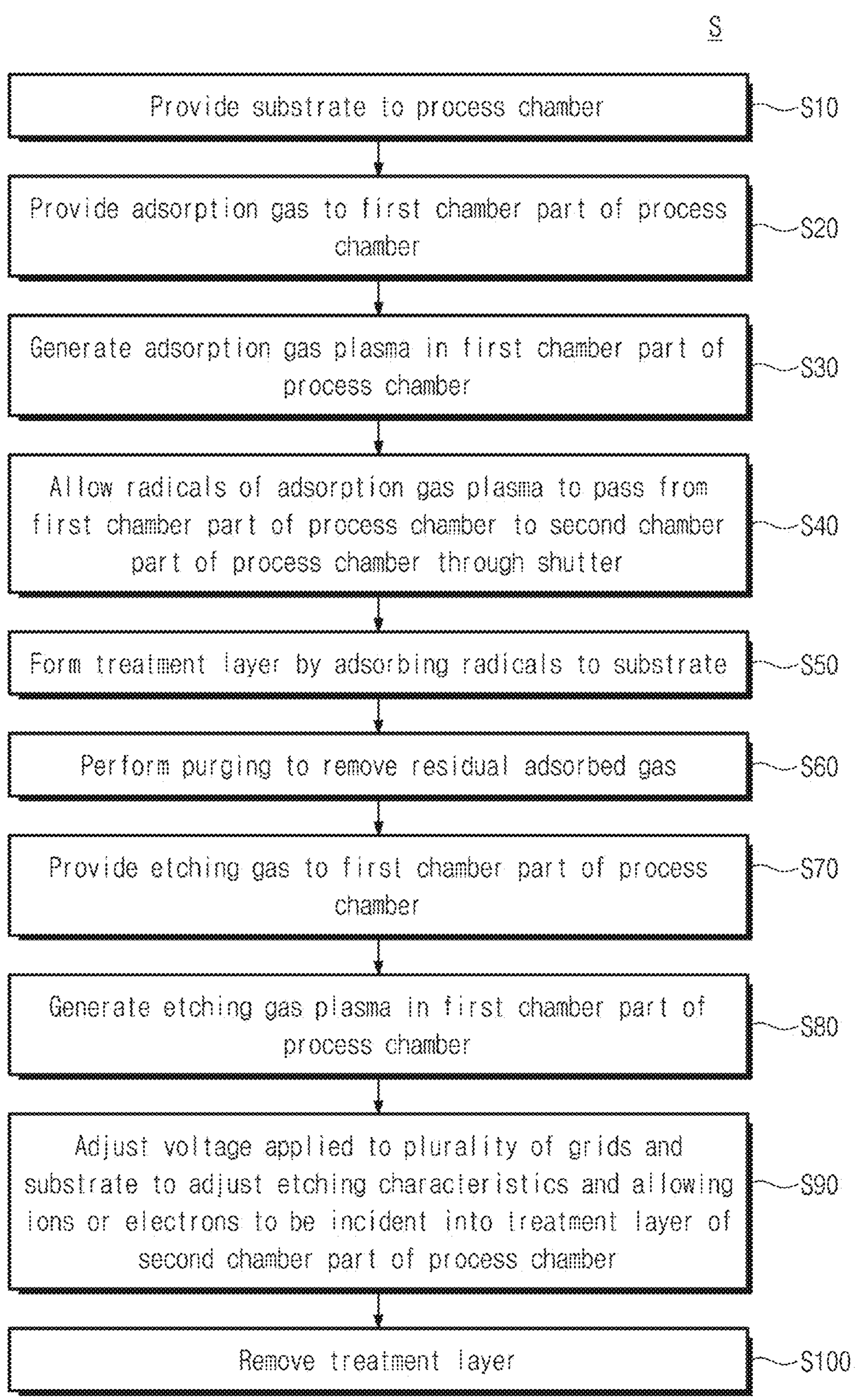
FIG. 2 is a flowchart illustrating a method for etching an atomic layer according to some embodiments.

FIG. 2 is a flowchart illustrating a method for etching an atomic layer (hereinafter, referred to as an atomic layer etching process) according to some embodiments.

Referring to FIG. 2, an atomic layer etching method (S) may be provided. The atomic layer etching method (S) may refer to a method of etching one surface of an object to be etched by using the atomic layer etching apparatus 1 described with reference to FIG. 1.

The atomic layer etching method (S) may include a process (S10) of providing a substrate 102 to a process chamber CB, a process (S20) of providing an adsorption gas to the first chamber part CB1 of the process chamber CB, a process (S30) of generating adsorption gas plasma PS1 in the first chamber part CB1 of the process chamber, a process (S40) of allowing radicals of the adsorption gas plasma PS1 to pass from the first chamber part CB1 of the process chamber CB to a second chamber part CB2 of the process chamber CB through a shutter, a process (S50) of forming a treatment layer 102_M by adsorbing the radicals to the substrate, a process (S60) of performing purging to remove a residual adsorption gas, a process (S70) of providing an etching gas to the first chamber part CB1 of the process chamber CB, a process (S80) of generating etching gas plasma in the first chamber part CB1 of the process chamber CB, a process (S90) of adjusting a voltage applied to a plurality of grids GR and the substrate 102 to adjust etching characteristics and allowing ions or electrons to be incident into the treatment layer 102_M of the second chamber part CB2 of the process chamber CB, and a process (S100) of removing the treatment layer 102_M. The atomic layer etching method (S) may include an adsorption process and a desorption process. The adsorption process may include operations S10 to S60. The desorption process may include operations S70 to S100. The process of adjusting the etching characteristics may include a process of adjusting plasma discharge in the second chamber part CB2, and the process of adjusting the plasma discharge in the second chamber part CB2 may include a process of adjusting the voltage applied to the plurality of grids GR and the substrate 102, but is not limited thereto.

Hereinafter, the plasma etching method (S) of FIG. 2 will be described in detail with reference to FIGS. 3A to 3D.

FIGS. 3A, 3B, 3C, and 3D are views sequentially illustrating the method for etching the atomic layer depending on the flowchart of FIG. 2.

Figure 3A:
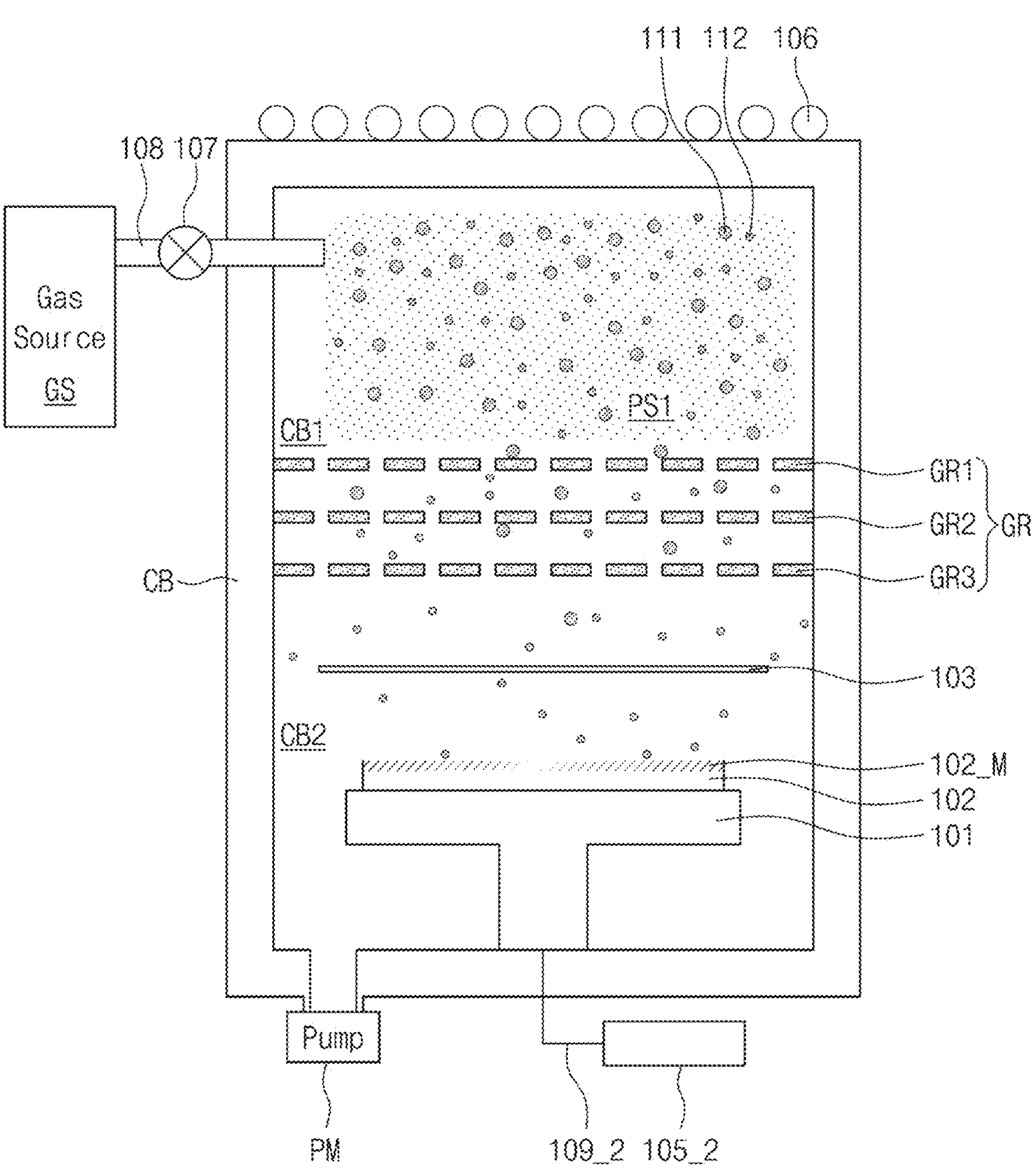
FIGS. 3A, 3B, 3C, and 3D are views sequentially illustrating the method for etching the atomic layer depending on the flowchart of FIG. 2.

Referring to FIG. 3A, the process (S10) of providing the substrate 102 to the process chamber CB may include a process of providing the substrate 102 on the support 101.

An adsorption process may be performed. The process (S20) of supplying the adsorption gas to the first chamber part CB1 of the process chamber CB may include a process of supplying the adsorption gas of the gas source GS to the first chamber part CB1 through the gas inlet 108 and the valve 107.

The process (S30) of generating the adsorption gas plasma PS1 in the first chamber part CB1 of the process chamber CB may include a process of applying a voltage to the coil part 106 to generate the adsorption gas plasma PS1 in the first chamber part CB1 of the process chamber CB. The adsorption gas plasma PS1 may include radicals 112, ions 111, and electrons of the adsorption gas.

The process (S40) of allowing the radicals 112 of the adsorption gas plasma PS1 to pass from the first chamber part CB1 of the process chamber CB to the second chamber part CB2 of the process chamber CB through the shutter 103 may include a process of allowing the radicals 112 of the adsorption gas plasma PS1 to pass through the shutter 103 and allowing the ions 111 of the adsorption gas plasma PS1 to access the substrate 102 by the shutter 103.

The radicals 112 of the adsorption gas plasma PS1 may pass from the first chamber part CB1 of the process chamber CB to the second chamber part CB2 of the process chamber CB through the shutter 103 (S40). The radicals 112 of the adsorption gas plasma PS1 may pass through the shutter 103. The access of the ions 111 of the adsorption gas plasma PS1 to the substrate 102 may be limited by the shutter 103.

When the ions 111 reach the substrate 102, the substrate 102 may be etched or impacted by the ions 111, and thus, the access of the ions 111 to the substrate 102 through the shutter 103 may be restricted. In this case, the radicals 112 may pass through the shutter 103 to access the substrate 102.

The process (S50) of forming the treatment layer 102_M by adsorbing the radicals 112 to the substrate 102 may include a process of allowing the radicals 112 to be incident and react on the substrate 102 so as to form the modified treatment layer 102_M and the treatment layer 102 that is not modified.

Figure 3B:
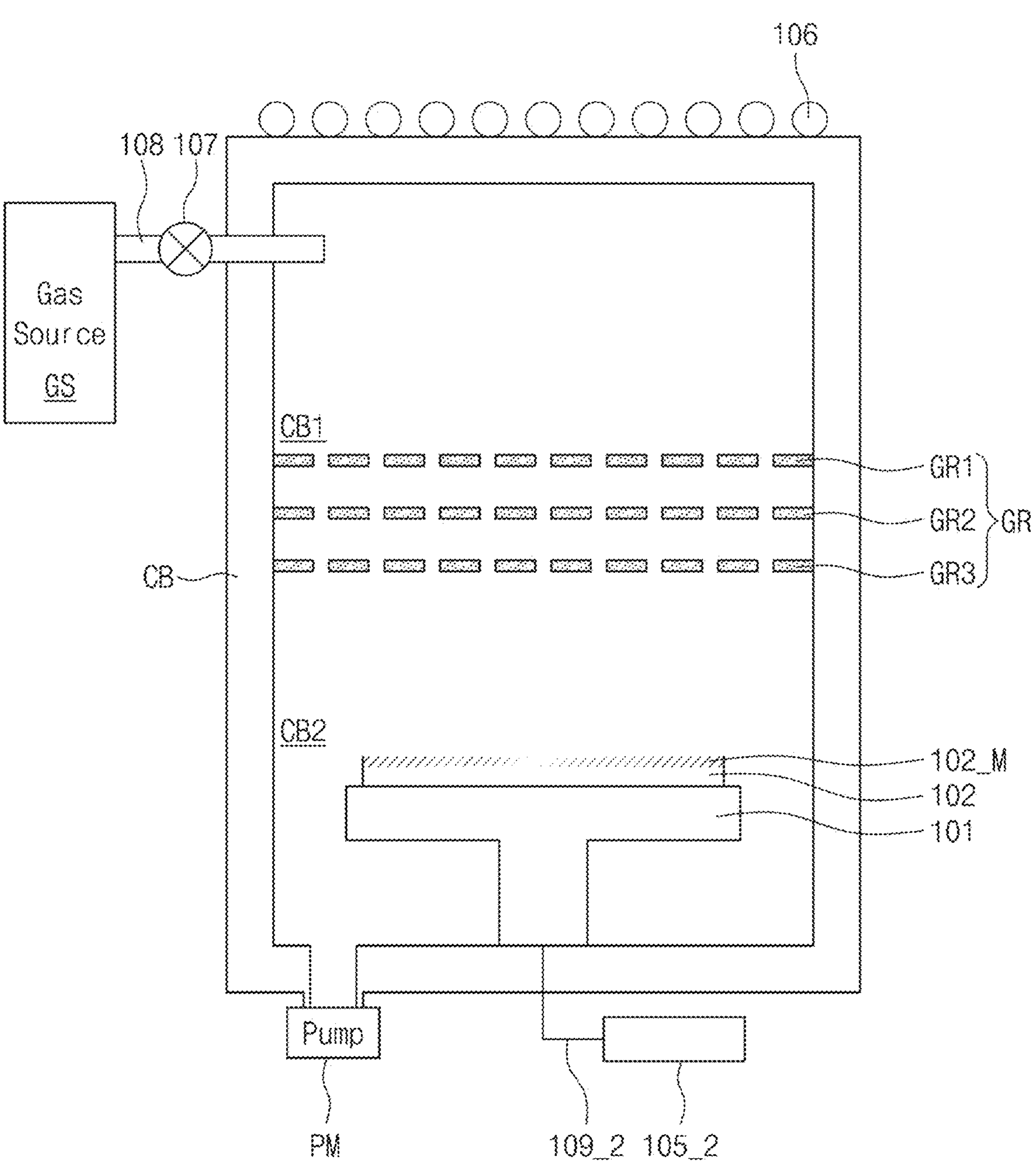

Referring to FIG. 3B, the process (S60) of performing the purging to remove the residual adsorption gas may include, for example, a process of injecting an inert gas into the process chamber CB through the gas inlet and the valve to exhaust the inert gas together with the residual adsorption gas through the pump PM. Before performing the purging to remove the residual adsorption gas, the shutter 103 may be removed from the second chamber part CB2.

Figure 3C:
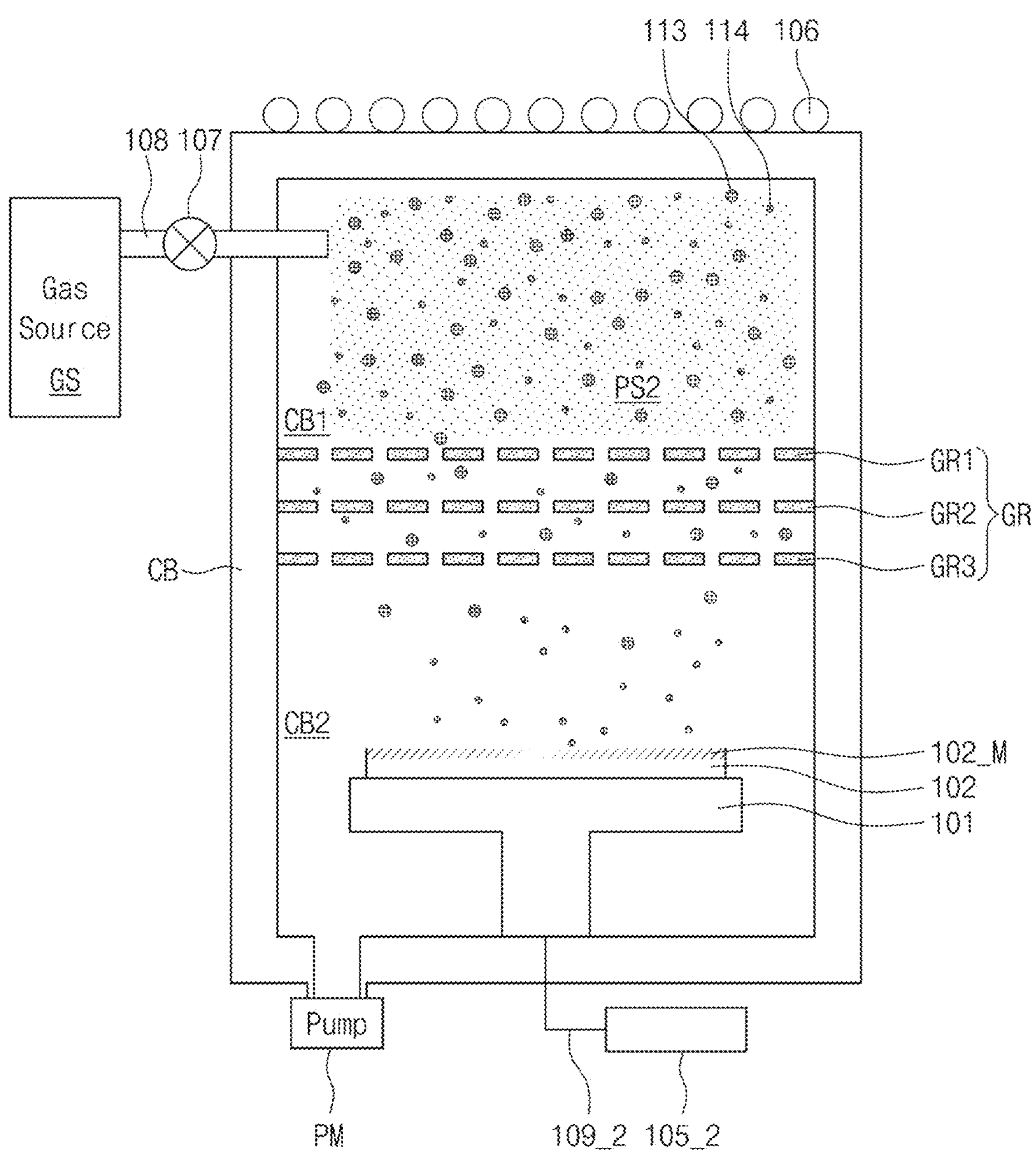

Referring to FIG. 3C, a desorption process may be performed. The process (S70) of supplying the etching gas to the first chamber part CB1 of the process chamber CB may include a process of supplying the etching gas of the gas source GS to the first chamber part CB1 through the gas inlet 108 and the valve 107.

The process (S80) of generating the etching gas plasma PS2 in the first chamber part CB1 of the process chamber CB may include a process of applying power of a first power supply part 105_2 to an electrode 106 through a first voltage feeding part 109_2 so as to generate the etching gas plasma PS2 in the first chamber part CB1 of the process chamber CB. The etching gas plasma PS2 may include radicals, ions 113, and electrons 114 of the etching gas.

The process of adjusting the etching characteristics may include a process of adjusting the plasma discharge in the second chamber part CB2. The process (S90) of adjusting the voltage applied to the plurality of grids GR and the substrate 102 so as to adjust the etching characteristics and allowing the ions or electrons to be incident into the treatment layer 102_M of the second chamber part CB2 of the process chamber CB may include a process of independently adjusting the voltages applied to a first grid GR1, a second grid GR2, a third grid GR3, and the substrate 102. The process of adjusting the etching characteristics is not limited thereto.

The process of independently adjusting the above-described voltages may include a process of applying a positive voltage to one of the first grid GR1, the second grid GR2, the third grid GR3, and the substrate 102 to allow the electrons 114 of the etching gas plasma PS2 to be incident into the treatment layer 102_M by passing through the plurality grids GR.

The process of independently adjusting the above-described voltages may include a process of applying a negative voltage to one of the first grid GR1, the second grid GR2, and the third grid GR3 to allow the ions 113 of the etching gas plasma PS2 to be incident into the treatment layer 102_M by passing through the plurality grids GR. The process of independently adjusting the above-described voltages may include a process of allowing the ions 113 of the etching gas plasma PS2 to pass through the plurality of grids GR so that the electrons 114 are incident into the treatment layer 102_M without applying the voltage to the substrate 102. Since the treatment layer 102_M into which the electrons 114 are incident has negative charges, the ions 113 may be incident into the treatment layer 102_M into which the electrons 114 are incident, thereby neutralizing the charges.

The process (S100) of removing the treatment layer 102_M may include a process of allowing the electrons 114 to inelastically collide with the treatment layer 102_M so as to transmit inelastic energy to the treatment layer 102_M so that the bonding of the treatment layer 102_M is broken.

Figure 3D:
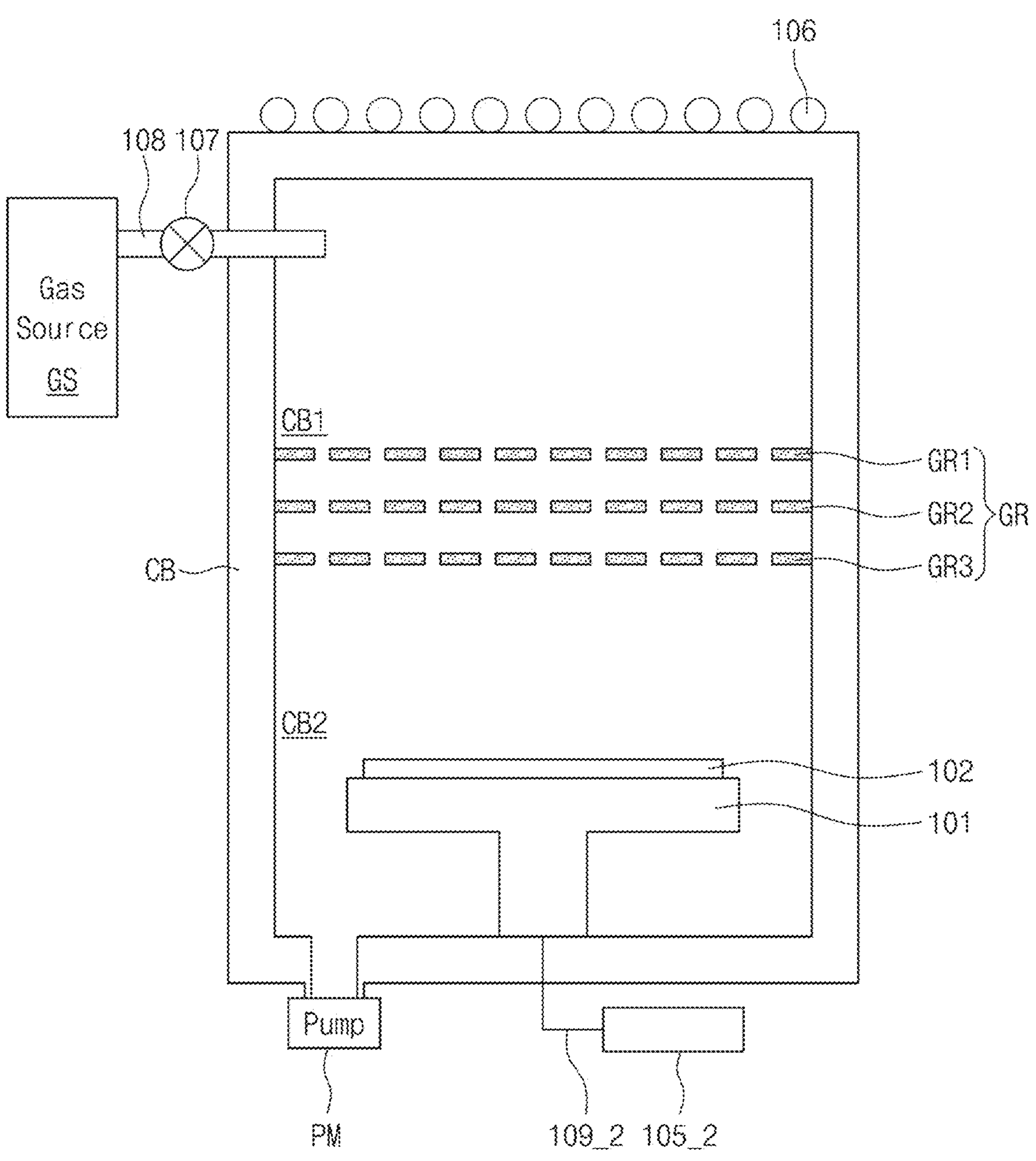

Referring to FIG. 3D, the removal of a portion of the treatment layer 102_M and the charge neutralization may be repeated until the entire treatment layer 102_M is detached. The electrons and ions of the etching gas plasma may be alternately incident into the treatment layer 102_M. The residual gas may be discharged through the pump PM in the purge process.

FIGS. 4A, 4B, 4C, and 4D are views illustrating a method for etching an atomic layer according to some embodiments.

Referring to FIGS. 4A to 4D, a process of adjusting a voltage applied to a plurality of grids GRa and a substrate 102*a* to adjust etching characteristics and allowing ions 113*a* and electrons 114*a* to be incident into a treatment layer 102_Ma will be described in detail.

Figure 4A:
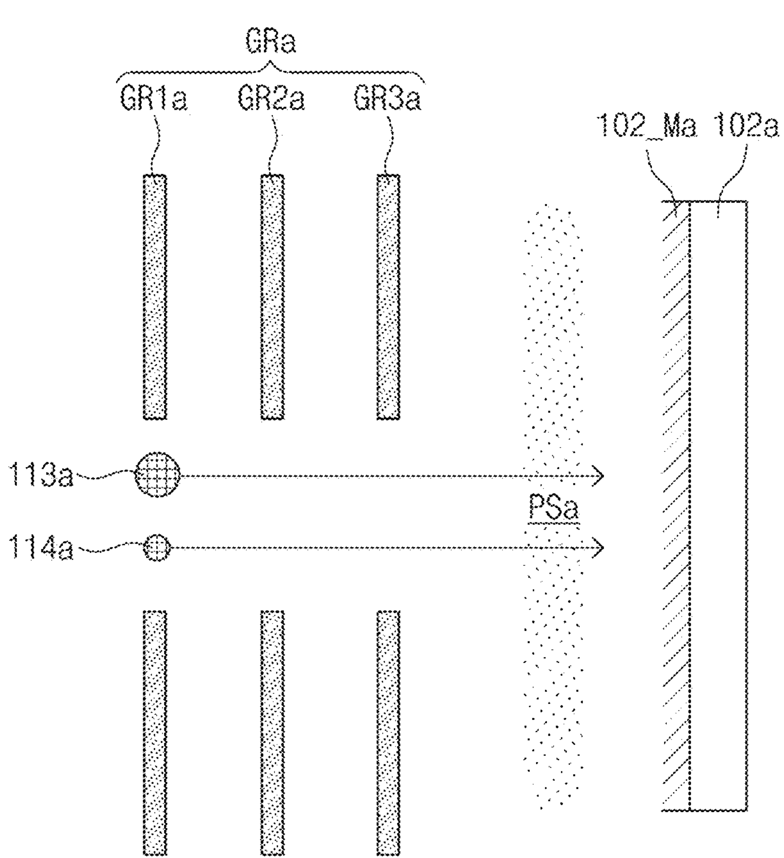
FIGS. 4A, 4B, 4C, and 4D are views illustrating a method for etching an atomic layer according to some embodiments.
Figure 4B:
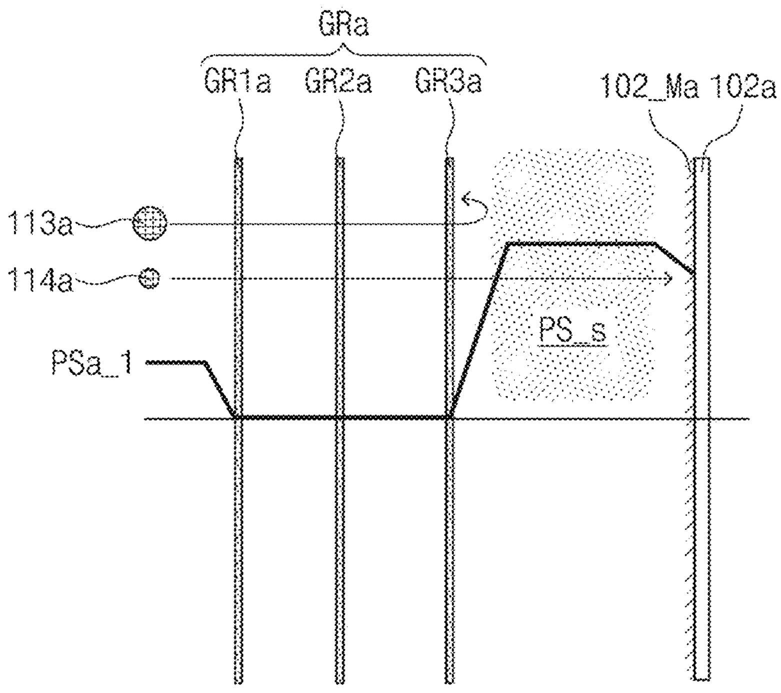
Figure 4C:
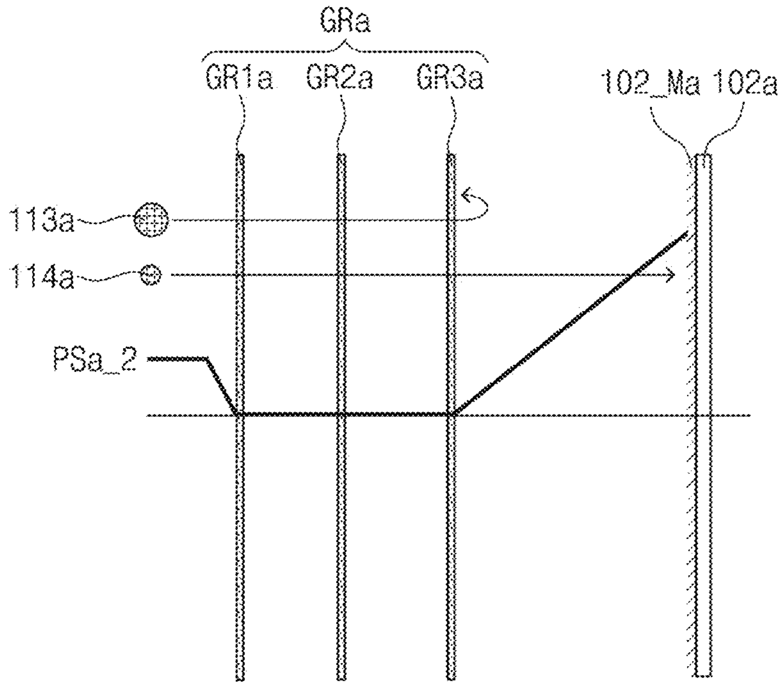

Referring to FIGS. 4A to 4C, when the plurality of grids GRa are grounded or floated, and a positive voltage is applied to the substrate 102*a*, plasma PSa may be floated on the treatment layer 102_Ma, and the electrons 114*a* may be incident into the treatment layer 102_Ma. In this case, isotropic desorption of the treatment layer 102_Ma due to the electrons 114*a* may be performed. The plurality of grids GRa may be grounded through a ground line or the like. The plurality of grids GRa may be floated without a separate ground line.

Since the plurality of grids GRa are grounded or floated, both the ions 113*a* and electrons 114*a* may pass through the grids GRa. Since the positive voltage is applied to the substrate 102*a*, the electrons 114*a* may be incident therein. Since the positive voltage is applied to the substrate 102*a*, the incident ions 113*a* may be limited. After the electrons 114*a* are incident, the treatment layer 102_Ma may have negative charges due to the electrons 114*a*.

Since the grids GRa are grounded or floated, the plasma PSa_1 may have a low potential difference near the grids GRa and then have a high potential difference near the substrate 102*a* to which the voltage is applied.

Referring to FIG. 4B, in an embodiment, lower plasma PS_s may be generated in the second chamber part CB2 by increasing in density of upper plasma. In this case, the density of the plasma PSa_1 increases up to a certain portion near the substrate 102*a* and then slightly decreases. When the lower plasma PS_s is floated on the treatment layer 102_Ma, a large amount of electrons 114*a* may be incident even when a low voltage is applied to the substrate 102*a*, and thus the isotropic desorption may be performed.

Referring to FIG. 4C, in another embodiment, the anisotropic etching may be performed when the lower plasma PS_s is not generated by decreasing in density of the upper plasma, and charge neutralization may be realized by applying a pulse voltage to the substrate 102*a*.

Figure 4D:
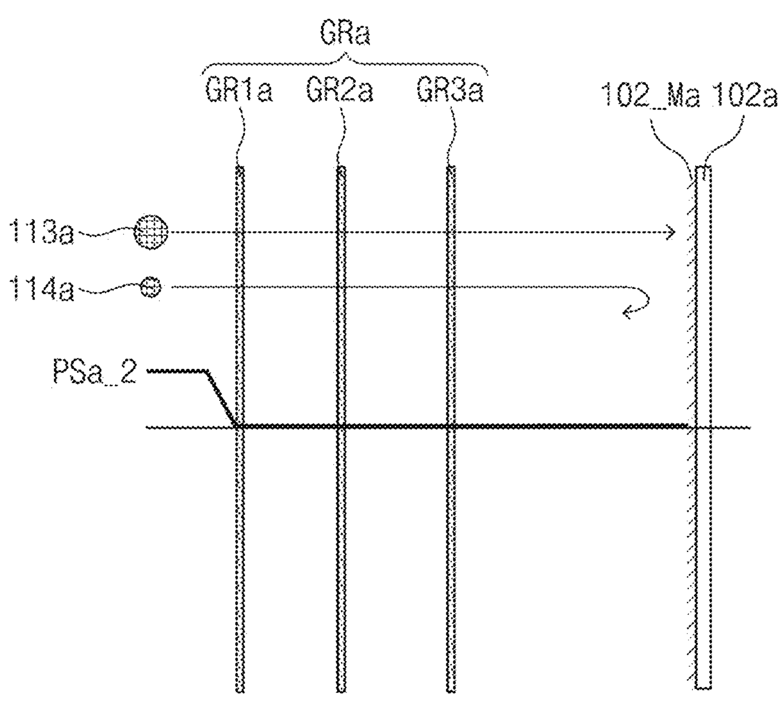

Referring to FIG. 4D, the plurality of grids GRa may be grounded or floated, and no voltage may be applied to the substrate 102*a*. Since the electrons 114*a* are incident into the treatment layer 102_Ma, the treatment layer 102_Ma may have the negative charges, and if no separate voltage is applied to the substrate 102*a*, the ions 113*a* may be incident with low energy to neutralize the charges. The above-described process may be performed by repeatedly operating the substrate 102*a* by applying the pulse voltage.

Since the grids GRa are grounded or floated, the plasma PSa_2 may have a low potential difference near the grids GRa and a low potential difference near the substrate 102*a* to which no voltage is applied.

The above-described removal of the treatment layer 102_Ma by the electrons 114*a* and the above-described charge neutralization by the ions 113*a* may be repeated until the entire treatment layer 102_Ma is removed.

FIGS. 5A, 5B, 5C, and 5D are views illustrating a method for etching an atomic layer according to some embodiments.

Referring to FIGS. 5A, 5B, 5C, and 5D, the process of adjusting the plasma discharge of the second chamber part CB2 to adjust the etching characteristics and the process of adjusting the voltage applied to the plurality of grids GRa and the substrate 102*a* to adjust the etching characteristics so as to allow the ions 113*a* or the electrons 114*a* to be incident into the treatment layer 102_Ma will be described in detail.

Figure 5A:
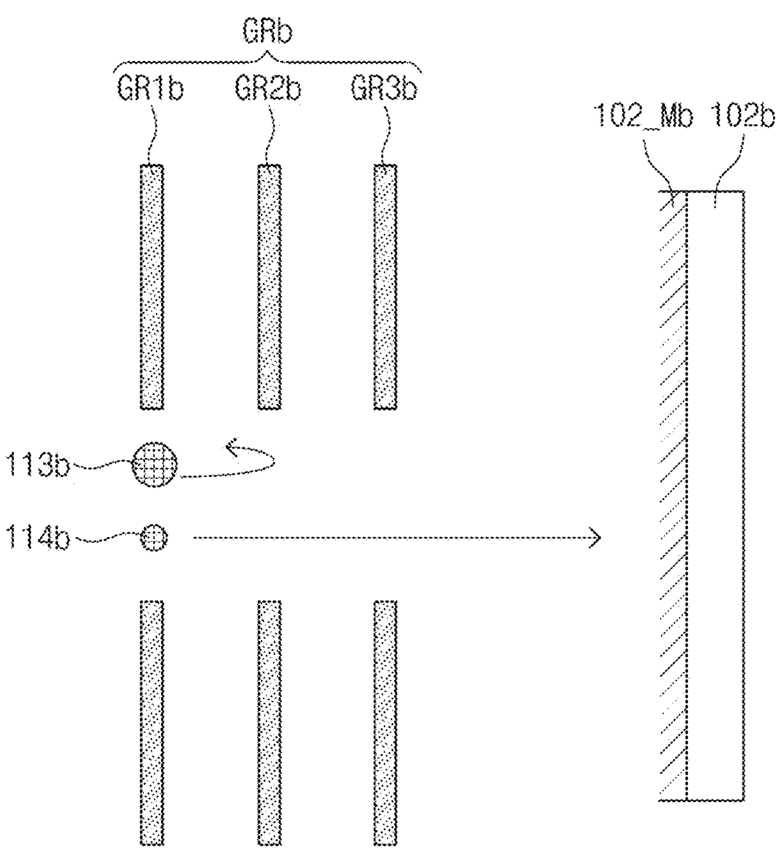
FIGS. 5A, 5B, 5C, and 5D are views illustrating a method for etching an atomic layer according to some embodiments.
Figure 5B:
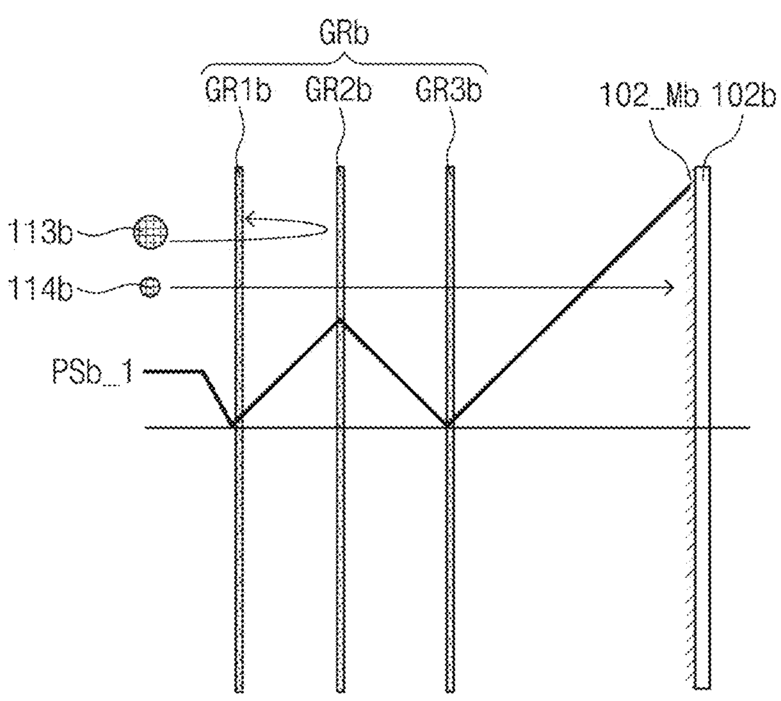

Referring to FIGS. 5A and 5B, a positive voltage may be applied to one or more grids GR2*b* of the plurality of grids GRb. In one embodiment, the positive voltage may be applied to the second grid GR2*b*. In this case, the electrons 114*b* may pass through the grids GRb and then be incident into the treatment layer 102_Mb, and the passing of the ions 113*b* through the plurality of grids GRb may be restricted by the positive voltage applied to the grids GR2*b*. The positive voltage may be applied to the substrate 102*b*. In this case, the electrons 114*b* may be accelerated by the positive voltage applied to the substrate 102*b*. Anisotropic desorption of the treatment layer 102_Mb due to the electrons 114*b* may be possible.

Figure 5C:
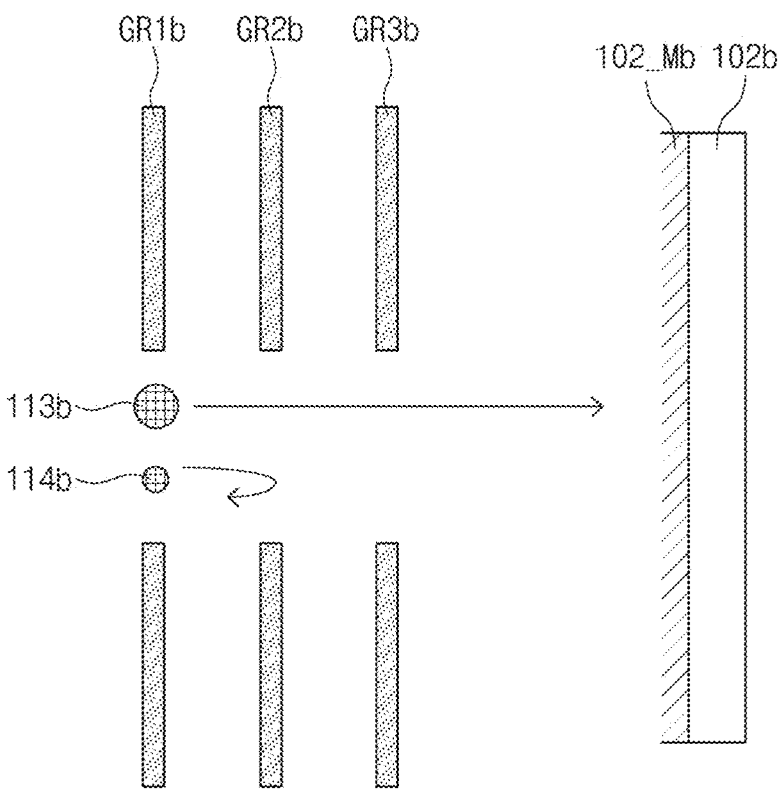
Figure 5D:
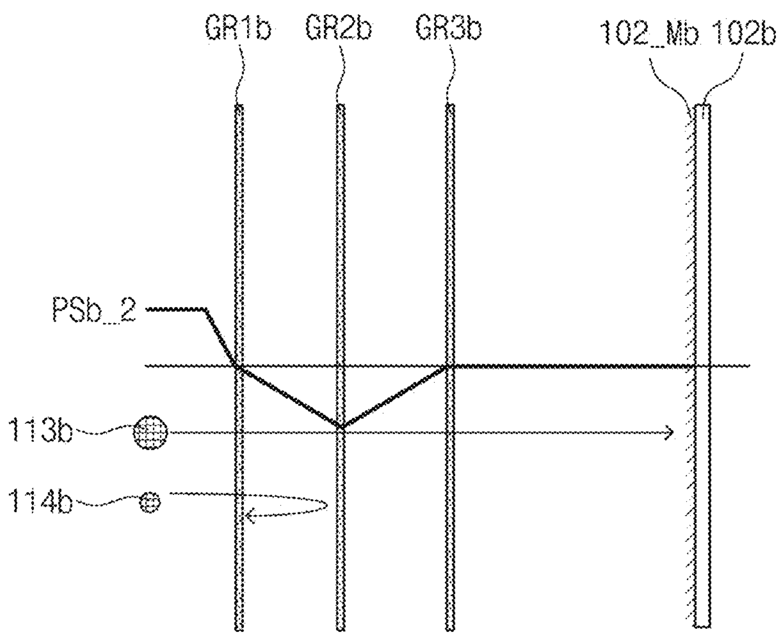

Since the voltage is applied to the second grid GR2*b*, the plasma PSb_1 may have a relatively high potential difference near the second grid GR2*b* and may have a high potential difference near the substrate 102*a* to which the voltage is applied. Referring to FIGS. 5C and 5D, a negative voltage may be applied to one or more grids GR2*b* of the plurality of grids GRb. In one embodiment, the negative voltage may be applied to the second grid GR2*b*. In this case, the ions 113*b* may pass through the grids GRb and then be incident into the treatment layer 102_Mb, and the passing of the electrons 114*b* through the plurality of grids GRb may be restricted by the negative voltage applied to the grids GR2*b*.

Since the electrons 114*b* are incident into the treatment layer 102_Mb, the treatment layer 102_Mb may have the negative charges, and if no separate voltage is applied to the substrate 102*b*, the ions 113*b* may be incident with low energy to neutralize the charges.

Since the voltage is applied to the second grid GR2*b*, the plasma PSb_2 may have a relatively high potential difference near the second grid GR2*b* and may have a high potential difference near the substrate 102*a* to which the voltage is applied.

The above-described removal of the treatment layer 102_Mb by the electrons 114*b* and the above-described charge neutralization by the ions 113*b* may be repeated until the entire treatment layer 102_Mb is removed.

Figure 6:
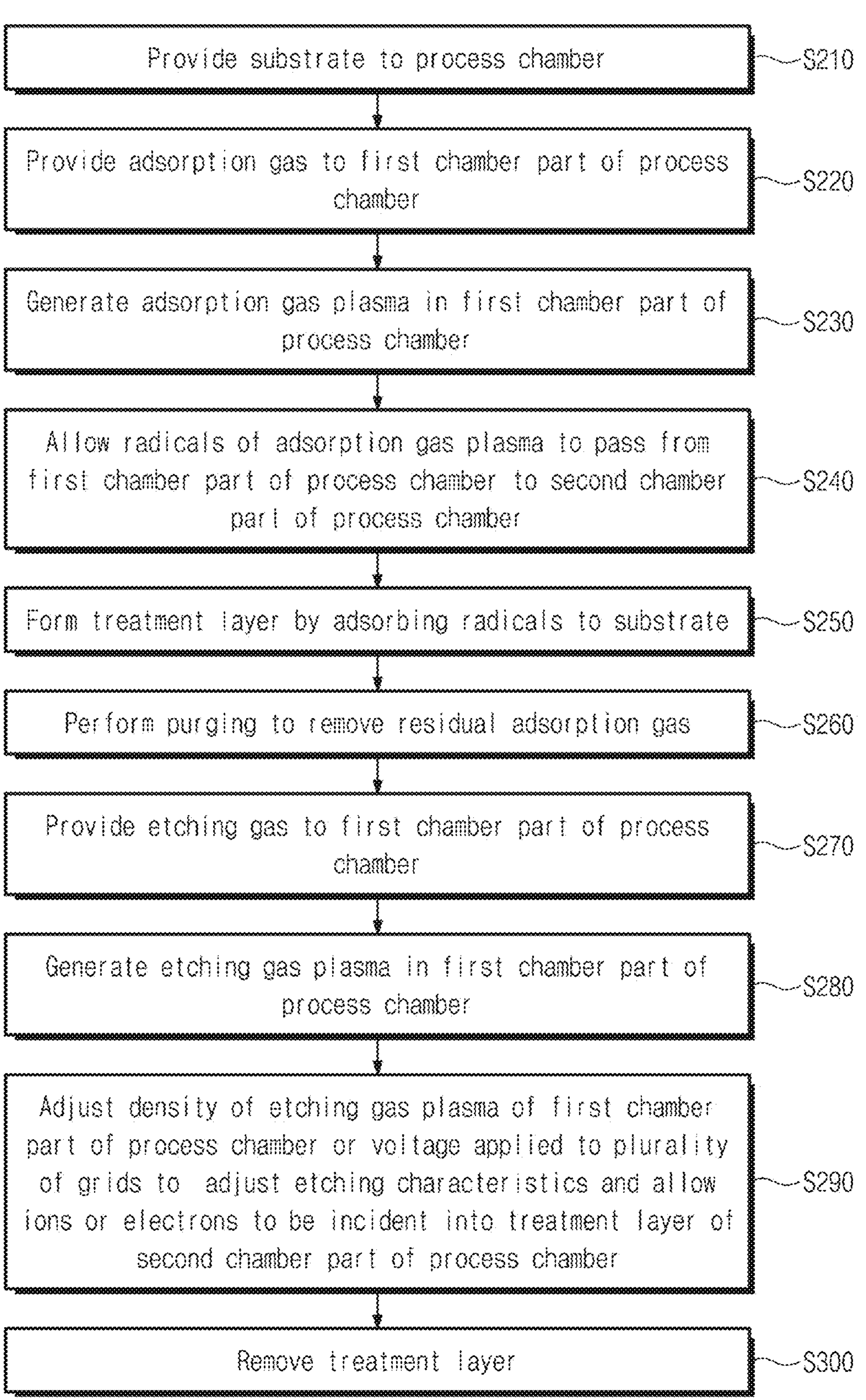
FIG. 6 is a flowchart illustrating a method for etching an atomic layer according to some embodiments.

FIG. 6 is a flowchart illustrating a method for etching an atomic layer according to some embodiments;

Referring to FIG. 6, an atomic layer etching method (S) may be provided. The atomic layer etching method (S) may refer to a method of etching one surface of an object to be etched using the atomic layer etching apparatuses 1 and 2 described with reference to FIGS. 1 and 2. The atomic layer etching method (S) may include a process (S210) of providing a substrate 102 to a process chamber CB, a process (220) of providing an adsorption gas to the first chamber part CB1 of the process chamber CB, a process (S230) of generating adsorption gas plasma PS1 in the first chamber part CB1 of the process chamber, a process (S240) of allowing radicals of the adsorption gas plasma PS1 to pass from the first chamber part CB1 of the process chamber CB to a second chamber part CB2 of the process chamber CB, a process (S250) of forming a treatment layer 102_M by adsorbing the radicals to the substrate, a process (S260) of performing purging to remove a residual adsorption gas, a process (S270) of providing an etching gas to the first chamber part CB1 of the process chamber CB, a process (S280) of generating etching gas plasma PS2 in the first chamber part CB1 of the process chamber CB, a process (S290) of adjusting a density of the etching gas plasma PS2 of the first chamber part CB1 of the process chamber CB or a voltage applied to the plurality of grids GR to adjust etching characteristics and allowing ions or electrons to be incident into the treatment layer 102_M of the second chamber part CB2 of the process chamber CB, and a process (S300) of removing the treatment layer 102_M.

Hereinafter, the plasma etching method (S) of FIG. 6 will be described in detail with reference to FIGS. 7A, 7B, 8A, and 8B.

Figure 7A:
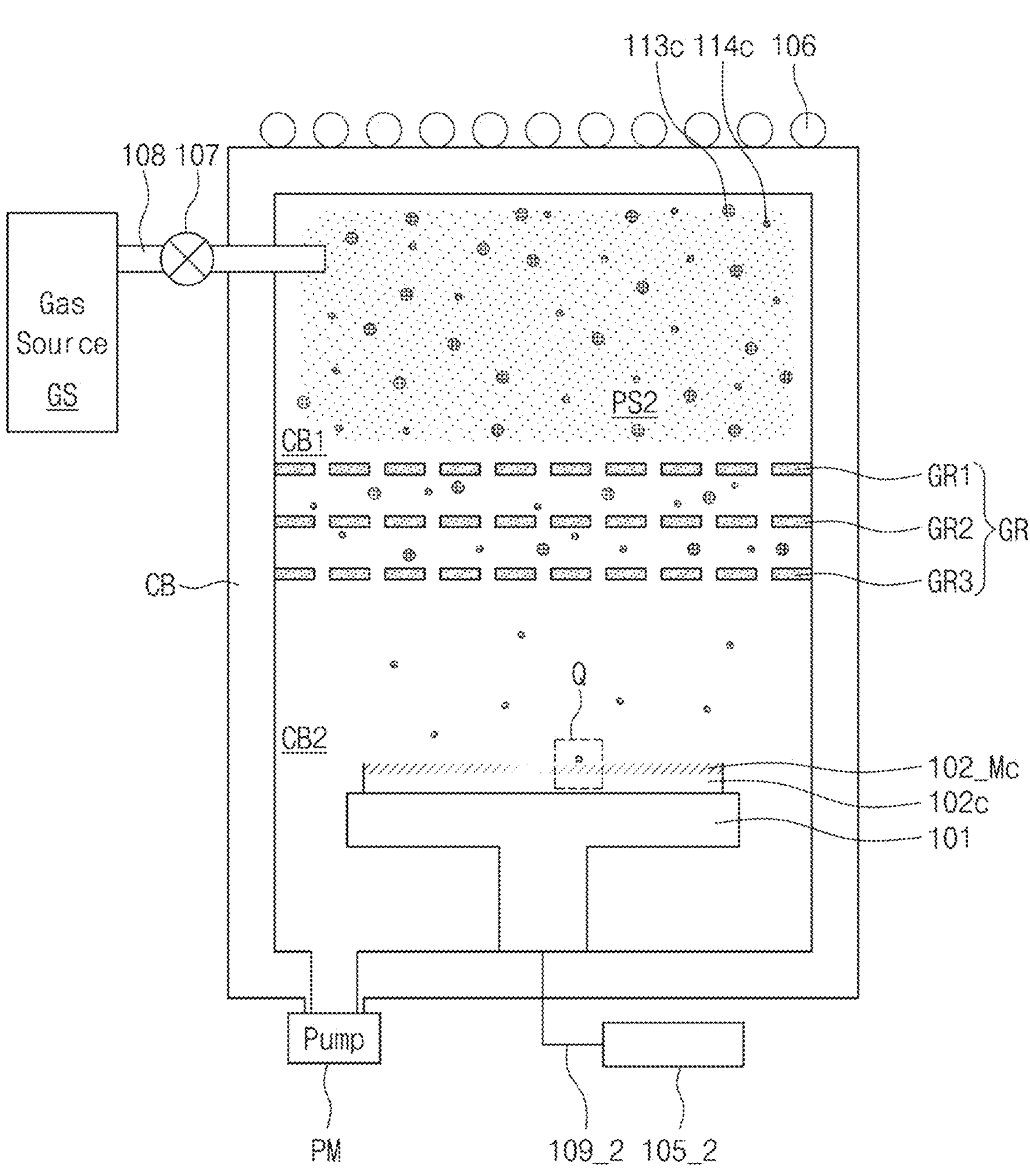
FIGS. 7A and 7B are views illustrating a method for etching an atomic layer according to some embodiments.
Figure 7B:
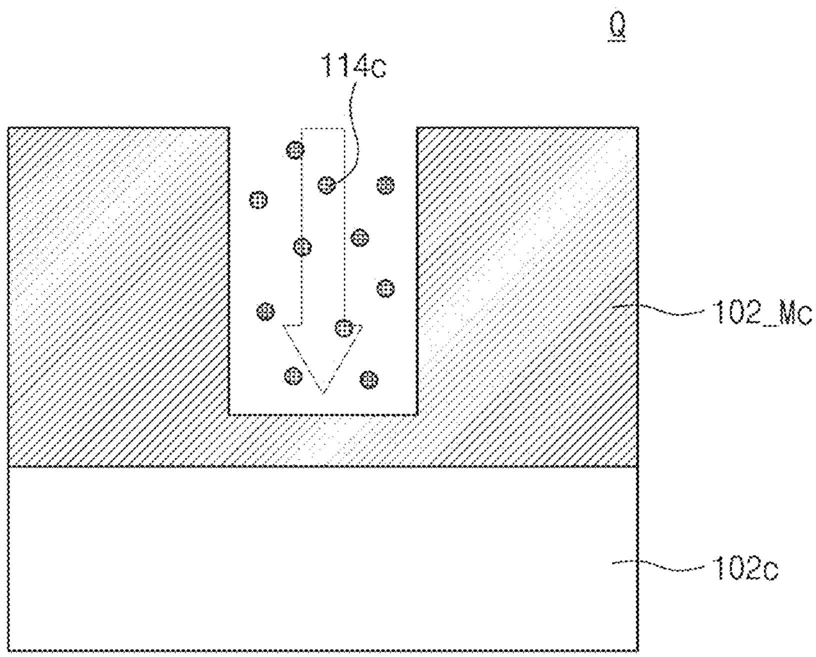

FIG. 7A is a view for explaining anisotropic etching by electrons. FIG. 7B is an enlarged view of an area Q in FIG. 7A.

Referring to FIGS. 7A and 7B, operations S210 to S280 of FIG. 6 may be performed, and radicals may be adsorbed to a substrate 102*c* to form a treatment layer 102_Mc. Subsequently, the treatment layer 102_Mc may be removed by electrons 114*c*.

A density of etching gas plasma PS1 may be adjusted (S290). As the density of the etching gas plasma increases, more electrons 114*c* may be incident into the treatment layer 102_Mc. The density of the etching gas plasma may increase by increasing in flow rate of an etching gas flowing from the gas source GS into the process chamber CB or by increasing in voltage applied to the process chamber CB through the coil part 106.

A positive voltage may be applied to the substrate 102*c*, and energy of the electrons 114*c* reaching the treatment layer 102_Mc may be adjusted to about 1 keV or less by adjusting magnitude of the applied voltage. In this case, straightness of the electrons 114*c* may be improved.

To perform anisotropic desorption on the treatment layer 102_Mc, the density of the etching gas plasma may decrease, and the voltage applied to the substrate 102*c* may increase so that the electrons 114*c* having enough energy to break intermolecular binding energy of the treatment layer 102_Mc may be incident. In the case of the anisotropic desorption, the electrons 114*c* may remove the treatment layer 102_Mc in a vertical direction (S300).

Figure 8A:
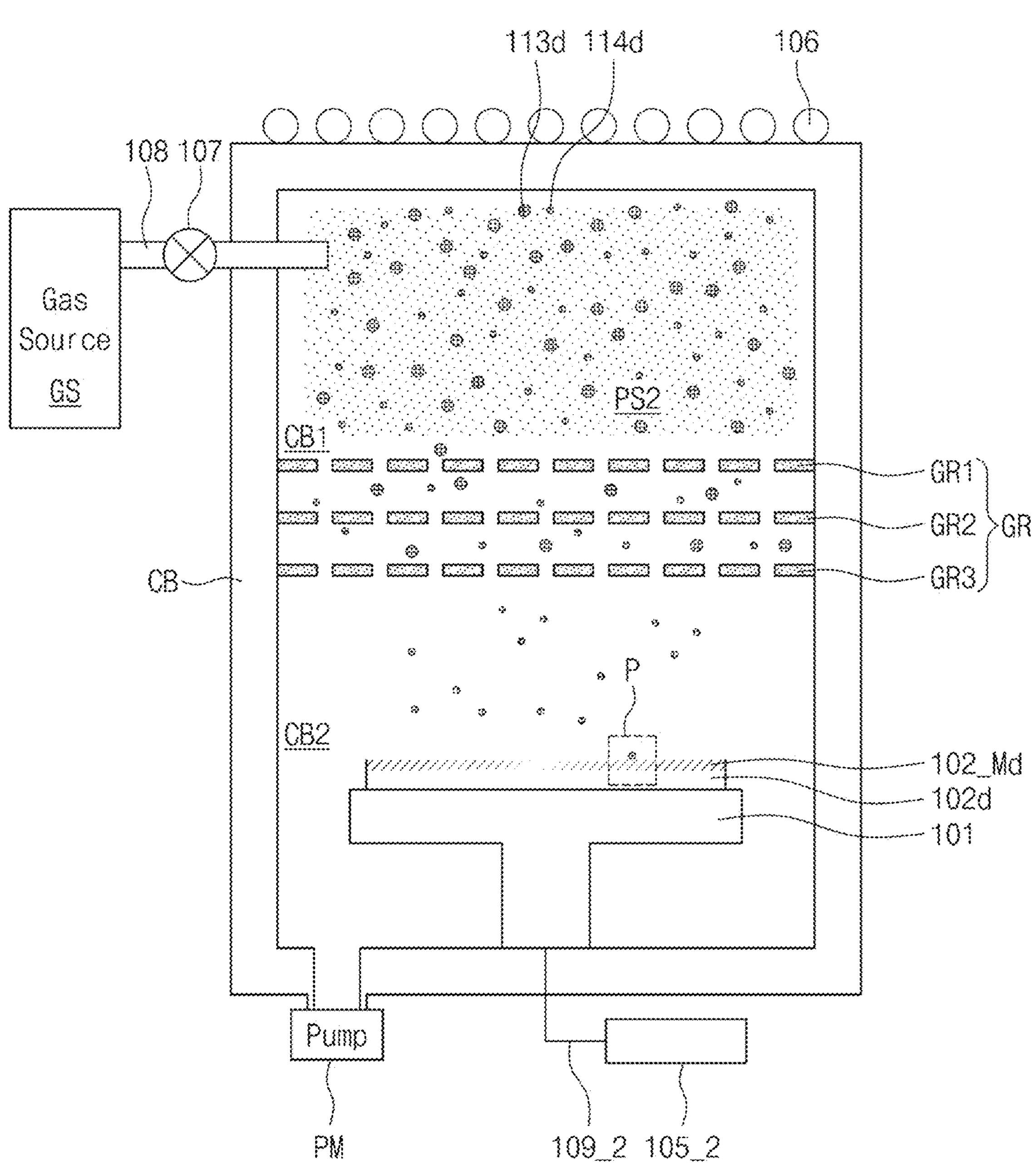
FIGS. 8A and 8B are views illustrating a method for etching an atomic layer according to some embodiments.
Figure 8B:
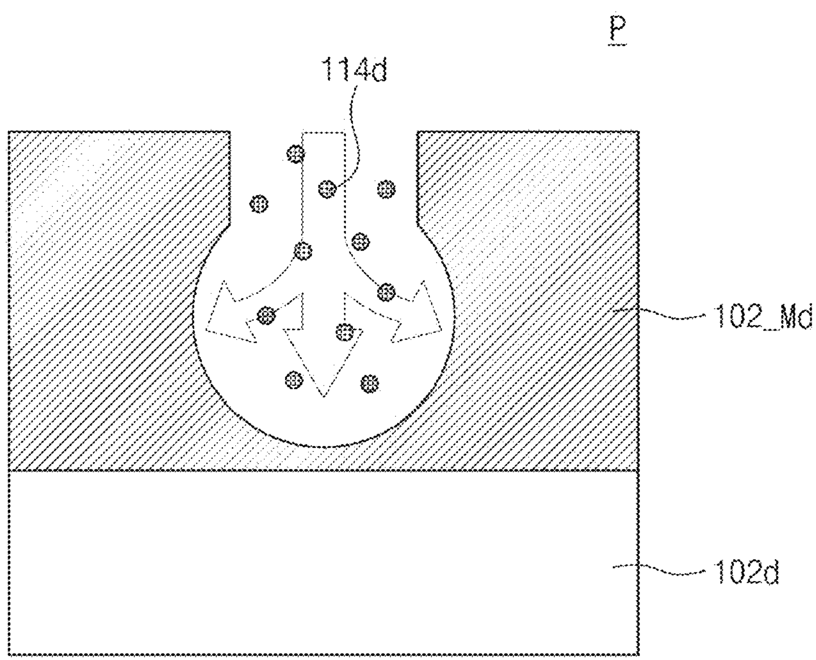

FIG. 8A is a view for explaining isotropic etching by electrons. FIG. 8B is an enlarged view of an area P in FIG. 8A.

Referring to FIGS. 8A and 8B, operations S210 to S280 of FIG. 6 may be performed, and radicals may be adsorbed to a substrate 102*d* to form a treatment layer 102_Md. Subsequently, the treatment layer 102_Md may be removed by the electrons 114*d*.

A density of the etching gas plasma PS1 or a voltage applied to the plurality of grids GR may be adjusted (S290). To perform isotropic desorption on the treatment layer 102_Md, when the density of the etching gas plasma increases, or the voltage applied to the plurality of grids GR is adjusted to control a density of the ions 113*a* descending to the second chamber CB2 or reduce the voltage applied to the substrate 102*d*, plasma may be discharged in the second chamber part CB2 of the process chamber CB, and many electrons 114*d* may be incident into the treatment layer 102_Md to apply heat. In this case, the isotropic desorption of the treatment layer 102_Md by the heat and the electrons 114*d* may be performed.

Energy of the electrons incident into the treatment layer 102_Md in the isotropic desorption may be less than that of the electrons incident into the treatment layer 102_Md in the anisotropic desorption. In the case of the isotropic desorption, the electrons 114*d* may remove the treatment layer 102_Md in all directions (S300).

An atomic layer etching method according to some embodiments may include both the process (S90) of adjusting a voltage applied to the plurality of grids to the etching characteristics and the substrate, which is described in FIG. 3 and the process (S290) of adjusting the density of the etching gas plasma to adjust the etching characteristics. The process of adjusting the etching characteristics may include a process of adjusting the plasma discharge in the second chamber part CB2. In this case, the etching characteristics may be adjusted according to the adjustment of the voltage applied to the plurality of grids and the substrate and the adjustment of the density of the etching gas plasma, but are not be limited thereto.

Figure 9A:
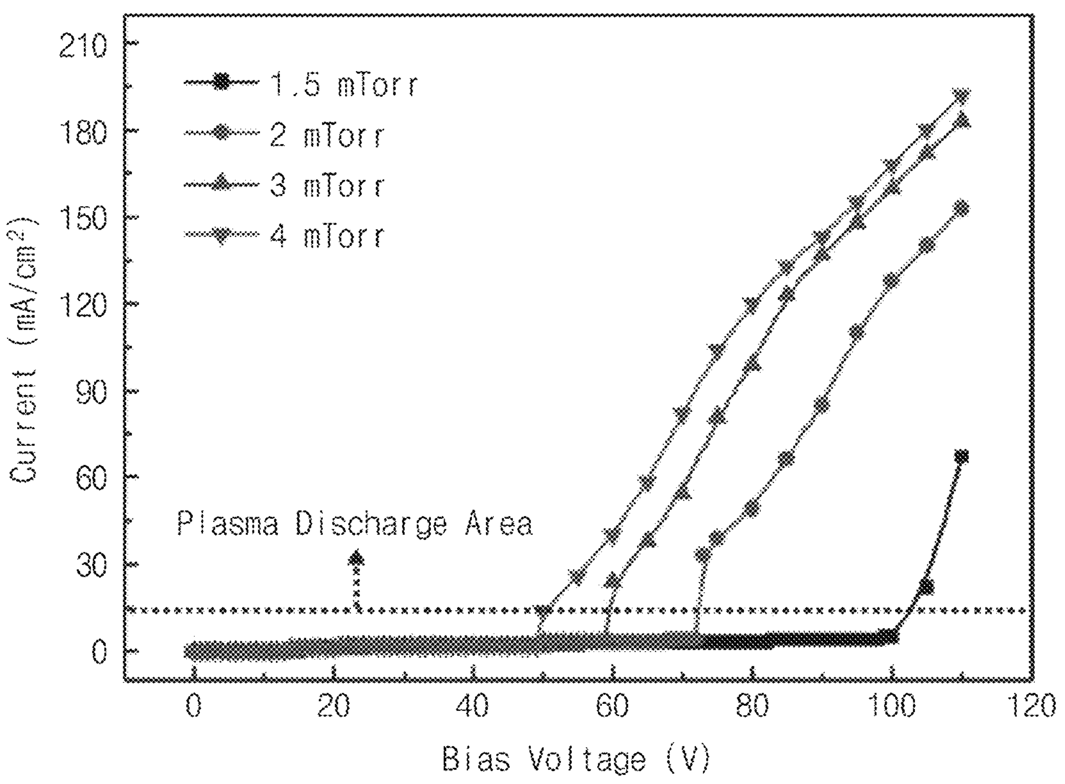
FIGS. 9A, 9B, and 9C are graphs for explaining the method for etching the atomic layer according to some embodiments.
Figure 9B:
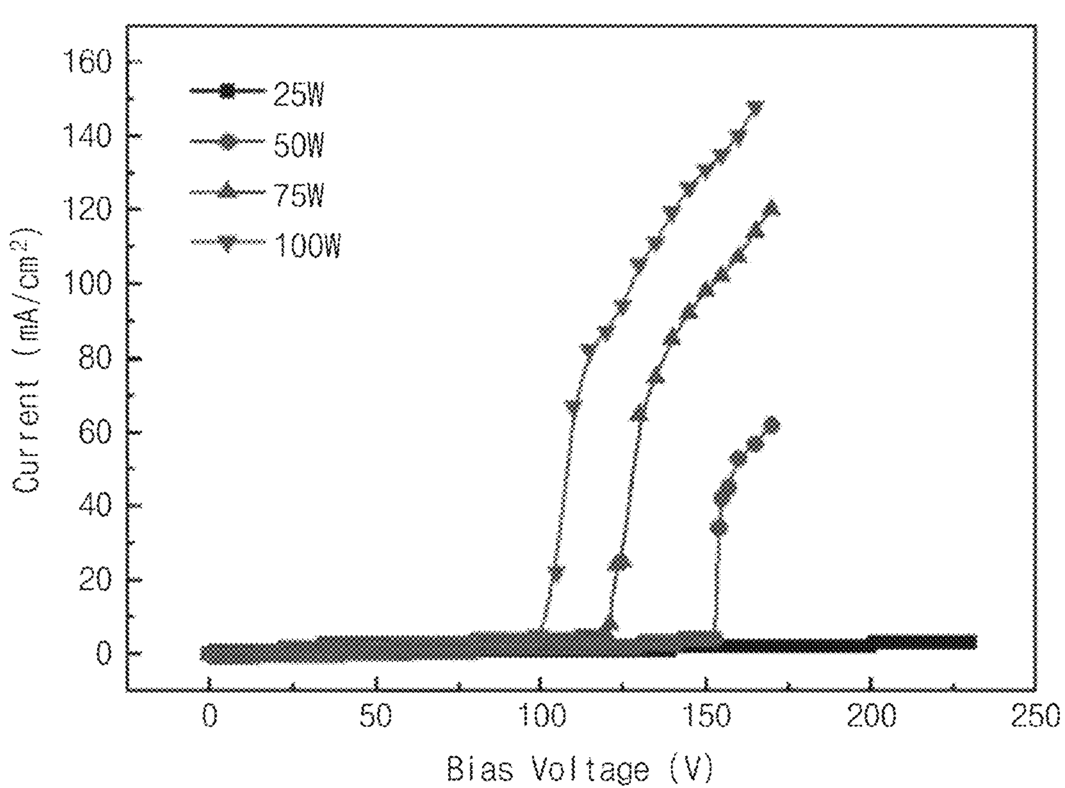
Figure 9C:
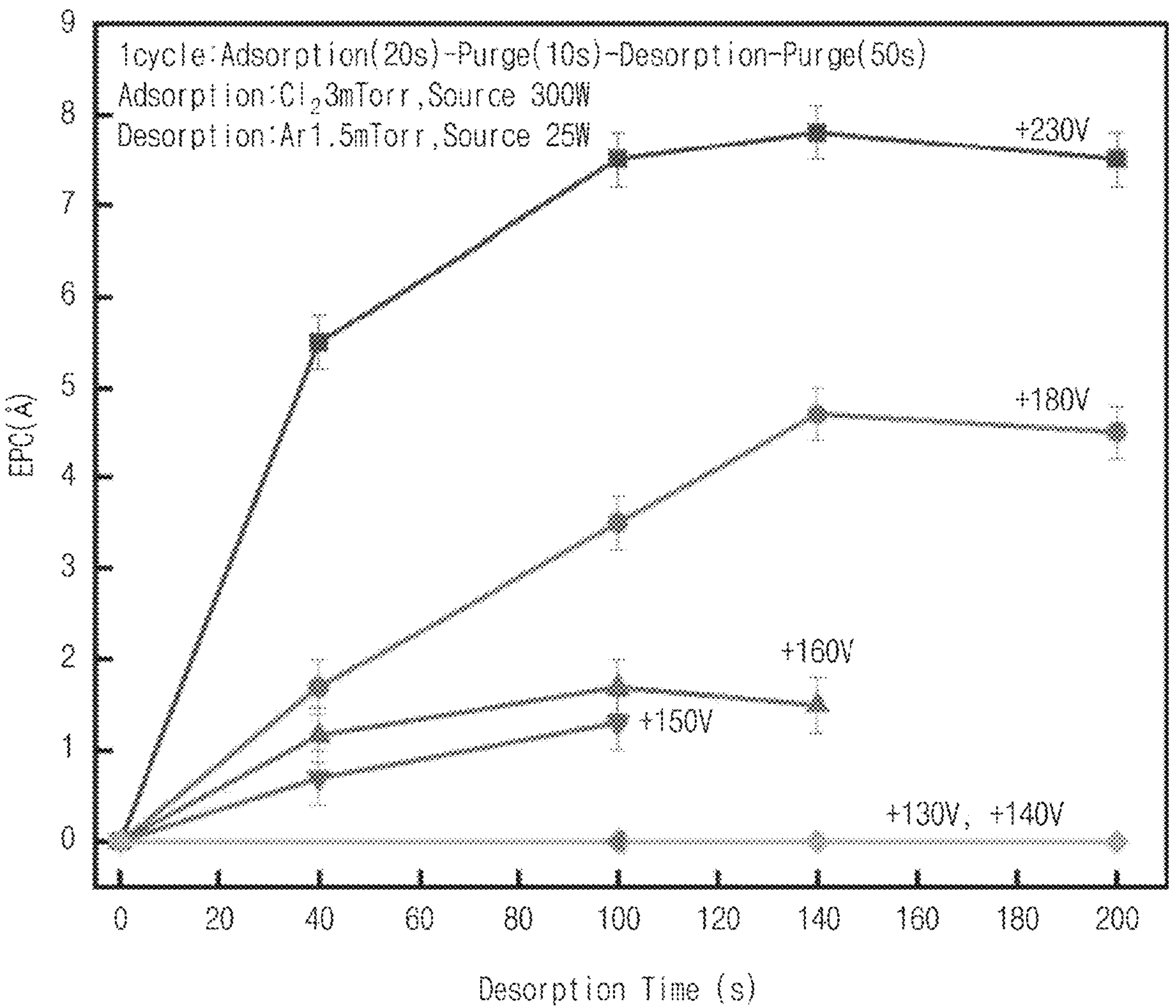

FIGS. 9A, 9B, and 9C are graphs for explaining the method for etching the atomic layer according to some embodiments.

A change in current amount according to a change in density of the etching gas plasma PS1 in the first chamber CB1 of the process chamber CB is provided. When plasma is discharged from the substrate 102 by increasing in density of the etching gas plasma PS1 to adjust the etching characteristics, isotropic etching by thermal energy may be performed according to an increase in current amount. If the plasma is not discharged from the substrate by decreasing in density of the etching gas plasma PS1, anisotropic etching by physical energy may be performed.

Referring to FIG. 9A, power of the coil part 106 may be fixed at about 100 W, an Ar gas may be used as the etching gas, and a flow rate of the Ar gas may be adjusted, and thus, results obtained by measuring current due to an increase in bias voltage applied to the substrate 102 may be provided. It is seen that as the flow rate of the Ar gas increases, the amount of current increases, and the plasma is discharged.

More specifically, as the Ar gas flow rate increases from about 1.5 mTorr to about 4 mTorr, a point, at which the current according to the voltage applied to the substrate 102 in the second chamber part CB2 rapidly increases, may gradually approach zero. As a result, it is confirmed that when the Ar gas flow rate increases, and the Ar gas plasma density of the first chamber part CB1 increases, a large amount of ions and electrons flow into a lower portion, and thus plasma discharge occurs well.

Referring to FIG. 9B, the Ar gas may be used as the etching gas flowing from the gas source GS into the process chamber CB, the flow rate of the Ar gas may be fixed at about 1.5 mTorr, and the power of the coil part 106 is adjusted, and thus, results obtained by measuring current due to an increase in bias voltage applied to the substrate 102 may be provided. As the power of the coil part 106 increases, it is confirmed that the amount of current increases, and the plasma is discharged.

More specifically, as the power of the coil part 106 increases from about 25 W to about 100 W, a point, at which the current according to the voltage applied to the substrate 102 in the second chamber part CB2 rapidly increases, may gradually increase to zero. As a result, it is confirmed that as the power of the coil part 106 increases, the plasma discharge occurs well.

Referring to FIG. 9C, etching of a silicon substrate using the electrons 114 may be confirmed. More specifically, as a result of about 100 cycles of atomic layer etching using electrons 114, it is seen that as the voltage applied to the substrate 102 increases, the etching amount per cycle (EPC) increases.

One cycle includes adsorption for about 20 seconds, purge for about 10 seconds, desorption, and purge for about 50 seconds.

In addition, it is seen that as the desorption time increases, the desorption time converges to a specific value, and additional etching does not occur.

It is seen that the etching depth varies according to the bias voltage applied to the substrate 102 during the atomic layer etching using the electrons 114.

Figure 10:
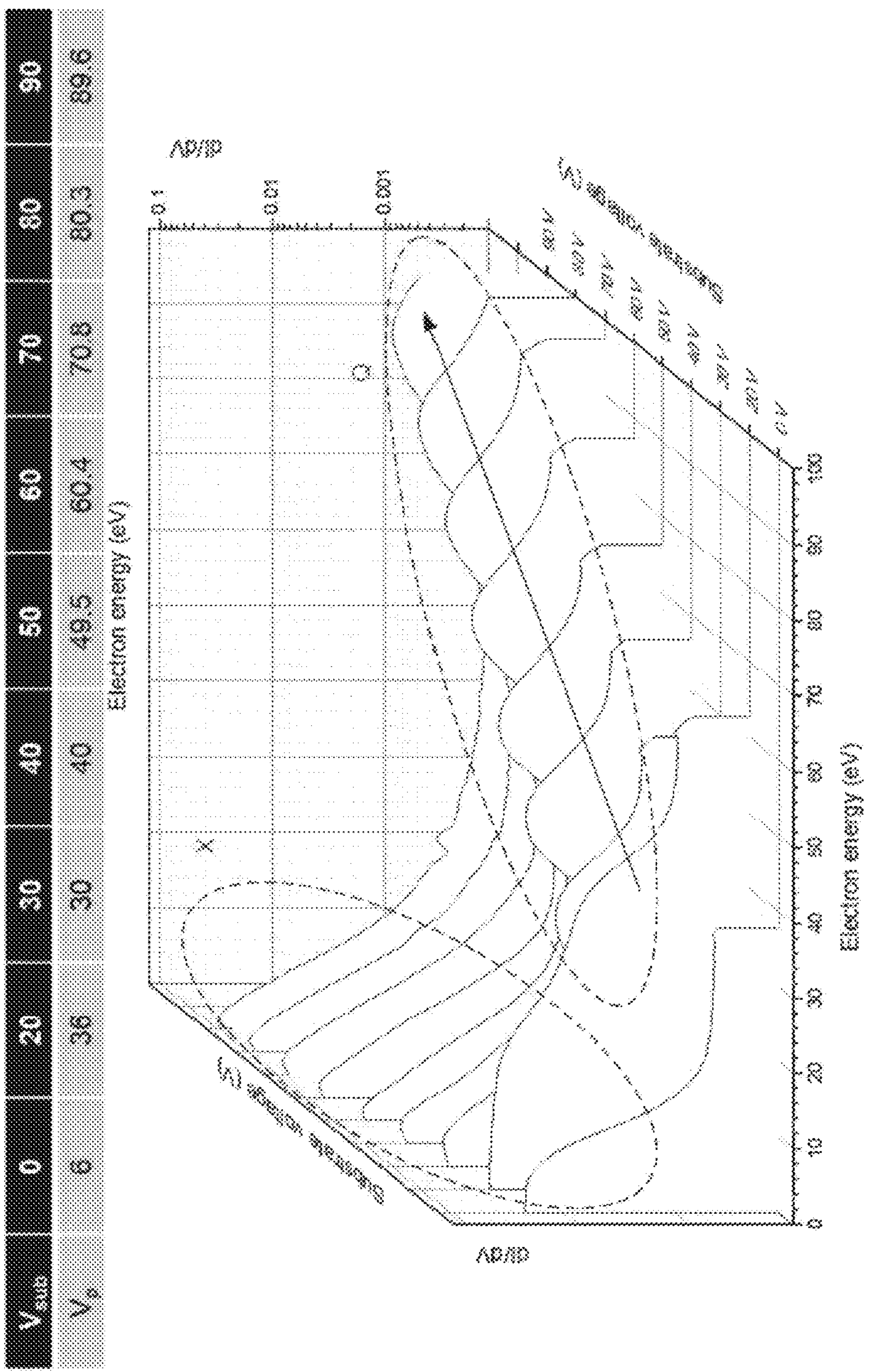
FIGS. 10 and 11 are graphs for explaining characteristics of the method for etching the atomic layer according to some embodiments.
Figure 11:
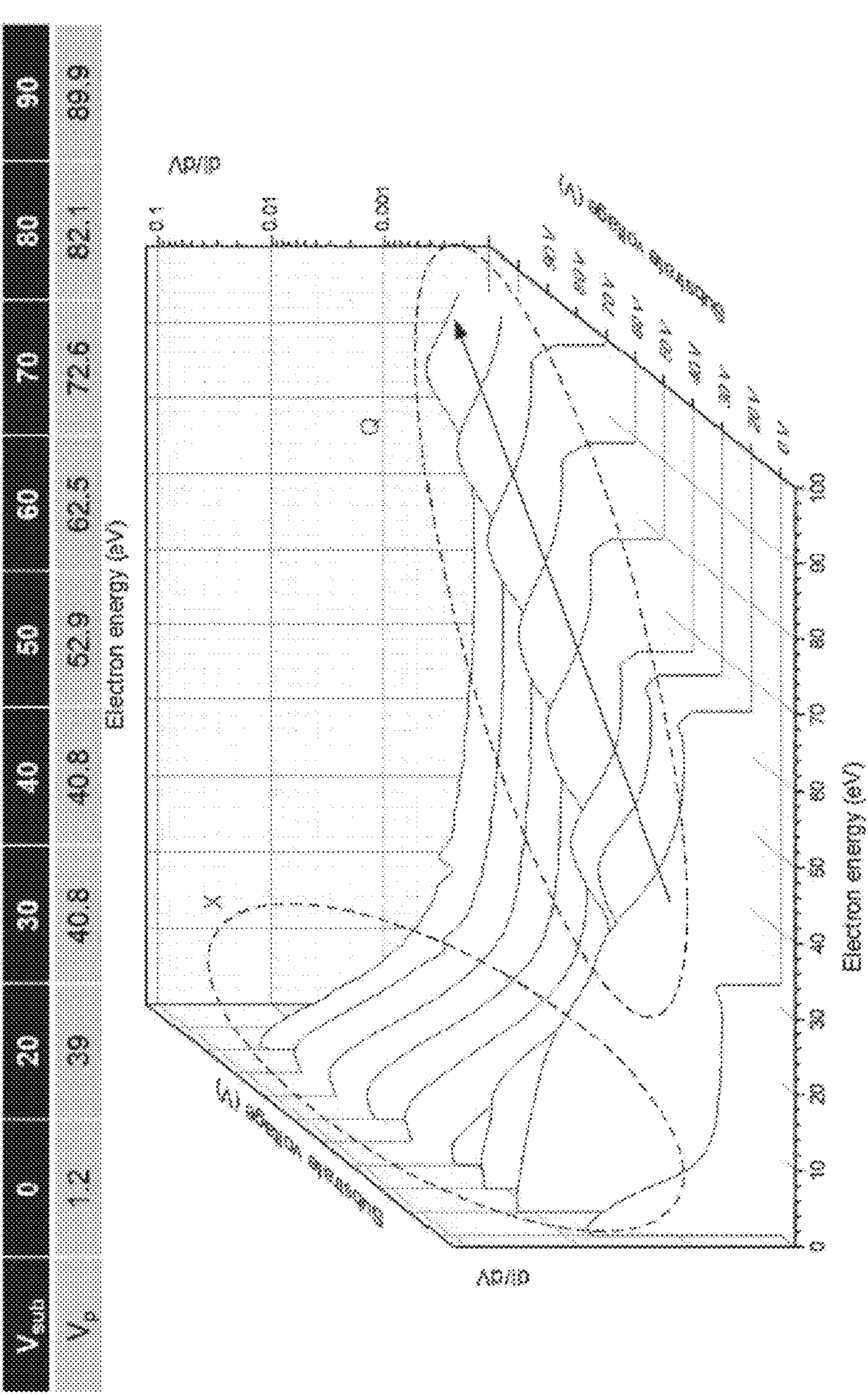

FIGS. 10 and 11 are graphs for explaining characteristics of the method for etching the atomic layer according to some embodiments.

Referring to FIG. 10, in the atomic layer etching method according to an embodiment, it is confirmed that as a voltage $V_{sub}$ applied to the substrate 102 is adjusted, energy of electrons 114 incident into the substrate 102 and a plasma potential $V_p$ on the substrate vary. FIG. 10 illustrates a graph obtained by measuring energy of the electrons 114 incident into the substrate 102 when an Ar gas is supplied as the etching gas at a flow rate of about 1 mTorr, power of the first power supply part of the first chamber part CB1 is set to about 50 W, and the first and third grids GR1 and GR3 are grounded or floated, a voltage of about 10 V is applied to the second grid GR2 to adjust the voltage applied to the substrate 102.

When the voltage $V_{sub}$ applied to the substrate increases from about +0 V to about +90 V, it is confirmed that the electrons 114 are incident into the substrate 102 with stronger energy, as shown in area Q.

Referring to FIG. 11, it is seen that the plasma density varies as the voltage applied to the grid GR increases compared to the embodiment of FIG. 10. FIG. 11 illustrates a graph obtained by measuring energy of the electrons 114 incident into the substrate 102 when an Ar gas is supplied as the etching gas at a flow rate of about 1 mTorr, power of the first power supply part 105_1 of the first chamber part CB1 is set to about 50 W, and the first and third grids GR1 and GR3 are grounded or floated, a voltage of about 50 V is applied to the second grid GR2 to adjust the voltage applied to the substrate 102.

When comparing the embodiment of FIG. 10 with the embodiment of FIG. 11, it is confirmed that when the voltage applied to the second grid GR2 is about 50V (see X in FIG. 12) rather than about 10 V (see X in FIG. 10), the density of plasma near the substrate decreases. As a result, it is confirmed that a plasma density value measured in the second chamber part CB2 of the process chamber CB decreases as the voltage applied to the grid GR increases.

According to the method for etching the atomic layer according to the embodiments of the inventive concept, the voltage of the plurality of grids and the substrate may be adjusted so that the electrons or ions are selectively incident.

According to the method for etching the atomic layer according to the embodiments of the inventive concept, the density of the plasma or the voltage of the grid may be adjusted to perform the isotropic etching or anisotropic etching according to whether the plasma discharge is present in the second chamber part.

According to the method for etching the atomic layer according to the embodiments of the inventive concept, since the etching occurs through the electrons, the structural defects of the object to be etched may be minimized.

The effects of the present invention are not limited to the aforementioned object, but other effects not described herein will be clearly understood by those skilled in the art from descriptions below.

Although the embodiment of the present invention is described with reference to the accompanying drawings, those with ordinary skill in the technical field of the present invention pertains will be understood that the present invention can be carried out in other specific forms without changing the technical idea or essential features. Thus, the above-disclosed embodiments are to be considered illustrative and not restrictive.

What is claimed is:

1. A method for etching an atomic layer, the method comprising:

providing a substrate to a process chamber, wherein the process chamber comprises a first chamber part and a second chamber part, and the substrate is provided in the second chamber part;

generating adsorption gas plasma in the first chamber part;

adsorbing radicals of the adsorption gas plasma to the substrate so as to form a treatment layer;

generating etching gas plasma in the first chamber part;

adjusting plasma discharge of the second chamber part by increasing a density of the etching gas plasma of the first chamber part to perform an isotropic desorption on the treatment layer or by decreasing the density of the etching gas plasma of the first chamber part to perform an anisotropic desorption on the treatment layer; and allowing electrons and ions of the etching gas plasma to be alternately incident into the treatment layer so as to perform desorption of the treatment layer, wherein the adsorbing the radicals of the adsorption gas plasma to the substrate comprises allowing the radicals of the adsorption gas plasma to pass from the first chamber part to the second chamber part, and the allowing the electrons and the ions of the etching gas plasma to be alternately incident into the treatment layer comprises adjusting a voltage applied to a plurality of grids between the first chamber part and the second chamber part or the substrate to allow the electrons and the ions of the etching gas plasma to be incident into the treatment layer.

2. The method of claim 1, wherein the allowing the electrons and the ions of the etching gas plasma to be alternately incident into the treatment layer comprises:

grounding or floating the plurality of grids and applying a positive voltage to the substrate to allow the electrons of the etching gas plasma to be incident into the treatment layer; and grounding or floating the plurality of grids and the substrate to allow the ions of the etching gas plasma to be incident into the treatment layer into which the electrons are incident.

3. The method of claim 1, wherein the plurality of grids comprise a first grid, a second grid, and a third grid, and the allowing the electrons and the ions of the etching gas plasma to be alternately incident into the treatment layer comprises applying a positive voltage to the second grid and grounding and floating the first grid and the third grid to allow the electrons of the etching gas plasma to be incident into the treatment layer.

4. The method of claim 1, wherein the plurality of grids comprise a first grid, a second grid, and a third grid, and the allowing the electrons and the ions of the etching gas plasma to be alternately incident into the treatment layer comprises applying a negative voltage to the second grid and grounding and floating the first grid and the third grid to allow the ions of the etching gas plasma to be incident into the treatment layer.

5. The method of claim 1, wherein the adjusting the voltage applied to the plurality of grids or the substrate comprises applying a positive voltage to the substrate and adjusting energy of the electrons of the etching gas plasma incident into the treatment layer to about 1 keV or less.

6. The method of claim 1, wherein the adjusting the voltage applied to the plurality of grids or the substrate comprises applying a pulse voltage.

7. A method for etching an atomic layer, the method comprising:

providing a substrate to a process chamber, wherein the process chamber comprises a first chamber part and a second chamber part, and the substrate is provided in the second chamber part;

generating adsorption gas plasma in the first chamber part;

adsorbing radicals of the adsorption gas plasma to the substrate so as to form a treatment layer;

generating etching gas plasma in the first chamber part;

adjusting plasma discharge of the second chamber part by increasing a density of the etching gas plasma of the first chamber part to perform an isotropic desorption on the treatment layer or by decreasing the density of the etching gas plasma of the first chamber part to perform an anisotropic desorption on the treatment layer; and allowing electrons and ions of the etching gas plasma to be alternately incident into the treatment layer so as to perform desorption of the treatment layer, wherein a plurality of grids are provided between the first chamber part and the second chamber part.

8. The method of claim 7, wherein the allowing the electrons and the ions of the etching gas plasma to be alternately incident into the treatment layer comprises adjusting a voltage applied to the plurality of grids between the first chamber part and the second chamber part or the substrate.

9. The method of claim 8, wherein the adjusting the voltage applied to the plurality of grids between the first chamber part and the second chamber part or the substrate comprises applying a positive voltage to one or more grids of the plurality of grids to pass the electrons of the etching gas plasma and to block the ions of the etching gas plasma.

10. The method of claim 8, wherein the adjusting the voltage applied to the plurality of grids between the first chamber part and the second chamber part or the substrate comprises applying a negative voltage to one or more grids of the plurality of grids to pass the ions of the etching gas plasma and to block the electrons of the etching gas plasma.

11. The method of claim 8, wherein the adjusting the voltage applied to the plurality of grids between the first chamber part and the second chamber part or the substrate comprises applying a pulse voltage.

12. The method of claim 7, further comprising:

before the generating the etching gas plasma in the first chamber part, purging residue of the adsorption gas plasma.

13. The method of claim 7, wherein the etching gas plasma comprises an inert gas.

14. The method of claim 7, wherein, in the performing the desorption on the treatment layer, allowing the electrons of the etching gas plasma to be incident into the treatment layer so as to remove a portion of the treatment layer and allowing the ions of the etching gas plasma to be incident into the treatment layer, into which the electrons are incident, to charge-neutralize the treatment layer are repeatedly performed.

15. The method of claim 7, wherein the electrons of the etching gas plasma incident into the treatment layer have energy of about 1 keV or less.

16. A method for etching an atomic layer, the method comprising:

providing a substrate to a process chamber, wherein the process chamber comprises a first chamber part and a second chamber part, and the substrate is provided in the second chamber part;

generating adsorption gas plasma in the first chamber part;

adsorbing radicals of the adsorption gas plasma to the substrate so as to form a treatment layer;

generating etching gas plasma in the first chamber part;

adjusting plasma discharge of the second chamber part by increasing a density of the etching gas plasma of the first chamber part to perform an isotropic desorption on the treatment layer or by decreasing the density of the etching gas plasma of the first chamber part to perform an anisotropic desorption on the treatment layer; and allowing electrons of the etching gas plasma to be incident into the treatment layer so as to remove a portion of the treatment layer; and allowing ions of the etching gas plasma to be incident into the treatment layer, into which the electrons are incident, to charge-neutralize the treatment layer, wherein the radicals of the adsorption gas plasma pass from the first chamber part to the second chamber part through a shutter, a removal of the portion of the treatment layer and a charge-neutralization of the treatment layer are repeatedly performed until the treatment layer is completely detached, and a voltage applied to a plurality of grids between the first chamber part and the second chamber part or the substrate is adjusted so that the electrons or the ions of the etching gas plasma are incident into the treatment layer.

* * * * *